United States Patent
Liu et al.

(10) Patent No.: US 10,211,838 B2
(45) Date of Patent: Feb. 19, 2019

(54) TIME-FREQUENCY DEVIATION COMPENSATION METHOD, AND USER TERMINAL

(71) Applicant: Huawei Technologies Co., Ltd., Shenzhen, Guangdong (CN)

(72) Inventors: Jiadi Liu, Beijing (CN); Xiangchun Wu, Beijing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/499,536

(22) Filed: Apr. 27, 2017

(65) Prior Publication Data

US 2017/0317681 A1    Nov. 2, 2017

(30) Foreign Application Priority Data

Apr. 28, 2016 (CN) .......................... 2016 1 0280723

(51) Int. Cl.
| | |
|---|---|
| H03L 1/02 | (2006.01) |
| H04W 76/28 | (2018.01) |
| H03B 5/32 | (2006.01) |
| H04L 7/08 | (2006.01) |
| H04W 48/10 | (2009.01) |
| H04W 56/00 | (2009.01) |

(52) U.S. Cl.
CPC ............... *H03L 1/026* (2013.01); *H03B 5/32* (2013.01); *H04L 7/08* (2013.01); *H04W 48/10* (2013.01); *H04W 56/001* (2013.01); *H04W 76/28* (2018.02)

(58) Field of Classification Search
CPC . H04B 5/32; H04L 1/026; H04L 7/08; H04W 48/10; H04W 56/001; H04W 76/048; H04W 76/28
USPC .......................................................... 370/328
See application file for complete search history.

(56) References Cited

U.S. PATENT DOCUMENTS

| | | | |
|---|---|---|---|
| 2002/0005765 A1* | 1/2002 | Ashley | H03L 1/026 331/176 |
| 2004/0232997 A1* | 11/2004 | Hein | H03L 1/022 331/16 |
| 2005/0093638 A1* | 5/2005 | Lin | H03L 1/026 331/176 |
| 2007/0178875 A1* | 8/2007 | Rao | H04W 52/028 455/343.1 |
| 2007/0205837 A1* | 9/2007 | McCorquodale | H03B 5/04 331/44 |
| 2008/0164952 A1* | 7/2008 | Babitch | G01K 7/32 331/66 |
| 2011/0261909 A1 | 10/2011 | Andgart et al. | |

(Continued)

FOREIGN PATENT DOCUMENTS

| | | |
|---|---|---|
| CN | 102065040 A | 5/2011 |
| CN | 102098250 A | 6/2011 |
| CN | 102325119 A | 1/2012 |

(Continued)

*Primary Examiner* — Stephen J Clawson

(57) ABSTRACT

Embodiments of the present invention disclose a time-frequency deviation compensation method, and a user terminal. A temperature compensation exception can be identified and a time-frequency deviation caused by the temperature compensation exception can be compensated by implementing the embodiments of the present invention.

22 Claims, 9 Drawing Sheets

(56) References Cited

U.S. PATENT DOCUMENTS

2015/0189613 A1* 7/2015 Chen .................. H04W 56/004
                                                  370/311
2017/0317681 A1* 11/2017 Liu ........................ H03L 1/026

FOREIGN PATENT DOCUMENTS

| CN | 102868649 A | 1/2013 |
| CN | 103379082 A | 10/2013 |
| CN | 103401673 A | 11/2013 |

\* cited by examiner

TIME-FREQUENCY DEVIATION COMPENSATION METHOD, AND USER TERMINAL

CROSS REFERENCE TO RELATED APPLICATIONS

This application claims priority to Chinese Patent Application No. 201610280723.0, filed on Apr. 28, 2016, which is hereby incorporated by reference in its entirety.

TECHNICAL FIELD

The present invention relates to the field of communications technologies, and in particular, to a time-frequency deviation compensation method, and a user terminal.

BACKGROUND

An oscillator is widely applied to the field of mobile communications technologies due to relatively high frequency stability. Currently, a quartz crystal oscillator is commonly used, and the quartz crystal oscillator can be classified into two types according to a frequency-temperature feature: One is a crystal oscillator (Crystal Oscillator, XO for short) without temperature compensation, which has relatively poor frequency stability and is easily affected by a temperature; the other is a temperature compensated crystal oscillator (Temperature Compensated Crystal Oscillator, TCXO for short), which refers to a crystal oscillator with a temperature compensation function. The XO is widely used on a low-cost baseband communications chip due to an obvious price advantage compared with the TCXO.

Because the XO does not have a temperature compensation module, an output frequency of the XO obviously varies with a temperature. When the XO is used as a reference clock source, a frequency deviation generated by the XO as a temperature changes needs to be estimated and compensated. A module that is on a user terminal and used to estimate and compensate a frequency deviation keeps in a working state when the user terminal is in a connected and non-DRX (Discontinuous Reception, discontinuous reception) state. Therefore, a frequency deviation can be correctly estimated and compensated. However, when a user terminal is in a DRX state and/or a module used to estimate and compensate a frequency deviation does not work, a temperature compensation module needs to be designed, so as to perform baseband or radio frequency compensation for a frequency variation. Currently, temperature compensation is generally implemented on a processor of the user terminal. Generally, an implementation method is to estimate, by using a curve fitting method, a feature that an XO output frequency varies with a temperature, measure temperatures before and after the temperature variation, calculate a difference between frequencies corresponding to the two temperatures according to a correspondence between a temperature and a frequency in a fitting curve, and perform baseband or radio frequency compensation according to the frequency difference. However, when a temperature of the XO drastically varies, after temperature compensation is performed by using the foregoing method, an excessively large frequency deviation may still remain in a system, thereby causing a temperature compensation exception, and the user terminal cannot perform normal communication.

SUMMARY

Embodiments of the present invention disclose a time-frequency deviation compensation method and a user terminal, so that a temperature compensation exception can be identified, a time-frequency deviation caused by the temperature compensation exception can be compensated, and a user terminal can still perform normal communication.

A first aspect of the embodiments of the present invention discloses a time-frequency deviation compensation method, and method is applied to a user terminal in a discontinuous reception DRX state. The method includes: measuring a temperature of an oscillator on the user terminal, so as to obtain a temperature variation amount of the oscillator from a first time point to a second time point in a DRX cycle, where the first time point is a sleep start moment in the DRX cycle, the second time point is a sleep end moment in the DRX cycle, the temperature of the oscillator may be measured by using a thermistor, a temperature sensor, an infrared thermometer, or the like, and the temperature variation amount may be a difference between two temperatures or a temperature variation rate in a period of time; determining a frequency variation amount of the oscillator in the DRX cycle according to the temperature variation amount and a preset mapping relationship between the temperature and a frequency; performing first frequency compensation on the user terminal according to the frequency variation amount; estimating a time deviation and a frequency deviation between the user terminal and a serving cell of the user terminal when the temperature variation amount exceeds a preset threshold (it may be considered that the temperature drastically varies), so as to obtain a time deviation estimated value and a frequency deviation estimated value; and performing time-frequency compensation on the user terminal according to the time deviation estimated value and the frequency deviation estimated value. In this way, the user terminal can identify a temperature compensation exception, and compensate a time-frequency deviation caused by the temperature compensation exception, so that the user terminal can still perform normal communication.

With reference to the first aspect of the embodiments of the present invention, in a first possible implementation manner of the first aspect of the embodiments of the present invention, the estimating a time deviation and a frequency deviation between the user terminal and a serving cell of the user terminal, so as to obtain a time deviation estimated value and a frequency deviation estimated value includes: enabling a cell search every preset time to determine the time deviation and the frequency deviation between the user terminal and the serving cell of the user terminal, so as to obtain the time deviation estimated value and the frequency deviation estimated value. In this way of periodically enabling the cell search, the time-frequency deviation between the user terminal and the serving cell can be monitored.

With reference to the first possible implementation manner of the first aspect of the embodiments of the present invention, in a second possible implementation manner of the first aspect of the embodiments of the present invention, the preset time is determined according to a temperature range to which a current temperature of the oscillator belongs and a preset correspondence. The preset correspondence includes a correspondence between multiple temperature ranges and at least one time value. Different temperature ranges may correspond to different preset times, or multiple temperature ranges may correspond to a same preset time.

With reference to the first or the second possible implementation manner of the first aspect of the embodiments of the present invention, in a third possible implementation manner of the first aspect of the embodiments of the present invention, the enabling a cell search every preset time to determine the time deviation and the frequency deviation between the user terminal and the serving cell of the user terminal, so as to obtain the time deviation estimated value and the frequency deviation estimated value includes: receiving, every the preset time, a first primary synchronization signal (Primary Synchronization Signal, PSS) and a first secondary synchronization signal (Secondary Synchronization Signal, SSS) in communication between the user terminal and the serving cell; separately performing cross-correlation processing between the first PSS and a pre-stored second PSS and between the first SSS and a pre-stored second SSS, so as to determine the time deviation between the user terminal and the serving cell, and using the time deviation as the time deviation estimated value; separately adjusting the first PSS and the first SSS according to the time deviation estimated value, to obtain a third PSS and a third SSS; and separately performing conjugate processing between the third PSS and the pre-stored second PSS and between the third SSS and the pre-stored second SSS, so as to determine the frequency deviation between the user terminal and the serving cell, and using the frequency deviation as the frequency deviation estimated value.

With reference to the first aspect of the embodiments of the present invention, in a fourth possible implementation manner of the first aspect of the embodiments of the present invention, the estimating a time deviation and a frequency deviation between the user terminal and a serving cell of the user terminal, so as to obtain a time deviation estimated value and a frequency deviation estimated value includes: receiving a first PBCH (Physical Broadcast Channel, physical broadcast channel) signal sent by the serving cell of the user terminal; performing cross-correlation processing between the first PBCH signal and a pre-stored PBCH signal, so as to determine the time deviation between the user terminal and the serving cell, and using the time deviation as the time deviation estimated value; adjusting the first PBCH signal according to the time deviation estimated value; and performing conjugate processing between the adjusted first PBCH signal and the pre-stored PBCH signal, so as to determine the frequency deviation between the user terminal and the serving cell, and using the frequency deviation as the frequency deviation estimated value.

With reference to any one of the first aspect, or the first to the fourth possible implementation manners of the first aspect of the embodiments of the present invention, in a fifth possible implementation manner of the first aspect of the embodiments of the present invention, the performing time-frequency compensation on the user terminal according to the time deviation estimated value and the frequency deviation estimated value includes at least one of the following cases: when the time deviation estimated value exceeds a first preset threshold (it may be considered that a large time deviation exists in a system), performing time compensation on the user terminal according to the time deviation estimated value; or when the frequency deviation estimated value exceeds a second preset threshold (it may be considered that a large frequency deviation exists in a system), performing, based on the first frequency compensation, second frequency compensation on the user terminal according to the frequency deviation estimated value.

With reference to any one of the first aspect, or the first to the fifth possible implementation manners of the first aspect of the embodiments of the present invention, in a sixth possible implementation manner of the first aspect of the embodiments of the present invention, after the performing time-frequency compensation on the user terminal according to the time deviation estimated value and the frequency deviation estimated value, the method further includes: receiving a second PBCH signal sent by the serving cell; demodulating the second PBCH signal; if the second PBCH signal fails to be demodulated, determining that a time-frequency deviation remaining on the user terminal after the time-frequency compensation exceeds a third preset threshold (it may be considered that an original time-frequency deviation is relatively large), where the third preset threshold is a maximum time-frequency deviation allowed for maintaining normal communication by the user terminal; and controlling the user terminal to perform a network search. If the second PBCH signal fails to be demodulated, it indicates that a relatively large time-frequency deviation still remains in a system. The relatively large remaining time-frequency deviation causes user terminal system hanging. Therefore, the user terminal cannot perform normal communication. The user terminal is controlled to perform a network re-search, so that the user terminal is reset to an initial state, system hanging can be terminated, and normal communication of the user terminal is restored.

A second aspect of the embodiments of the present invention discloses a user terminal, including a processor, a receiver, and an oscillator, where the oscillator is configured to separately provide the processor and the receiver with a frequency signal required in working; and the processor is configured to: measure a temperature of the oscillator when the user terminal is in a discontinuous reception DRX state, so as to obtain a temperature variation amount of the oscillator from a first time point to a second time point in a DRX cycle, where the first time point is a sleep start moment in the DRX cycle, the second time point is a sleep end moment in the DRX cycle, the temperature of the oscillator may be measured by using a thermistor, a temperature sensor, an infrared thermometer, or the like, and the temperature variation amount may be a difference between two temperatures or a temperature variation rate in a period of time; determine a frequency variation amount of the oscillator in the DRX cycle according to the temperature variation amount and a preset mapping relationship between the temperature and a frequency; perform first frequency compensation on the user terminal according to the frequency variation amount; estimate a time deviation and a frequency deviation between the user terminal and a serving cell of the user terminal when the temperature variation amount exceeds a preset threshold (it may be considered that the temperature drastically varies), so as to obtain a time deviation estimated value and a frequency deviation estimated value; and perform time-frequency compensation on the user terminal according to the time deviation estimated value and the frequency deviation estimated value. In this way, the user terminal can identify a temperature compensation exception, and compensate a time-frequency deviation caused by the temperature compensation exception, so that the user terminal can still perform normal communication.

With reference to the second aspect of the embodiments of the present invention, in a first possible implementation manner of the second aspect of the embodiments of the present invention, the processor is configured to enable a cell search every preset time to determine the time deviation and the frequency deviation between the user terminal and the serving cell of the user terminal, so as to obtain the time deviation estimated value and the frequency deviation estimated value. In this way of periodically enabling the cell search, the time-frequency deviation between the user terminal and the serving cell can be monitored.

With reference to the first possible implementation manner of the second aspect of the embodiments of the present invention, in a second possible implementation manner of the second aspect of the embodiments of the present invention, the preset time is determined according to a temperature range to which a current temperature of the oscillator belongs and a preset correspondence. The preset correspondence includes a correspondence between multiple temperature ranges and at least one time value. Different temperature ranges may correspond to different preset times, or multiple temperature ranges may correspond to a same preset time.

With reference to the first or the second possible implementation manner of the second aspect of the embodiments of the present invention, in a third possible implementation manner of the second aspect of the embodiments of the present invention, the processor is configured to: receive, every the preset time by using the receiver, a first primary synchronization signal PSS and a first secondary synchronization signal SSS in communication between the user terminal and the serving cell; separately perform cross-correlation processing between the first PSS and a pre-stored second PSS and between the first SSS and a pre-stored second SSS, so as to determine the time deviation between the user terminal and the serving cell, and use the time deviation as the time deviation estimated value; separately adjust the first PSS and the first SSS according to the time deviation estimated value, to obtain a third PSS and a third SSS; and separately perform conjugate processing between the third PSS and the pre-stored second PSS and between the third SSS and the pre-stored second SSS, so as to determine the frequency deviation between the user terminal and the serving cell, and use the frequency deviation as the frequency deviation estimated value.

With reference to the second aspect of the embodiments of the present invention, in a fourth possible implementation manner of the first aspect of the embodiments of the present invention, the processor is configured to: receive, by using the receiver, a first physical broadcast channel PBCH signal sent by the serving cell of the user terminal; perform cross-correlation processing between the first PBCH signal and a pre-stored PBCH signal, so as to determine the time deviation between the user terminal and the serving cell, and use the time deviation as the time deviation estimated value; adjust the first PBCH signal according to the time deviation estimated value; and perform conjugate processing between the adjusted first PBCH signal and the pre-stored PBCH signal, so as to determine the frequency deviation between the user terminal and the serving cell, and use the frequency deviation as the frequency deviation estimated value.

With reference to any one of the second aspect, or the first to the fourth possible implementation manners of the second aspect of the embodiments of the present invention, in a fifth possible implementation manner of the second aspect of the embodiments of the present invention, the processor is configured to: perform first frequency compensation on at least one of the oscillator, the processor, or the receiver according to the frequency variation amount.

With reference to any one of the second aspect, or the first to the fourth possible implementation manners of the second aspect of the embodiments of the present invention, in a fifth possible implementation manner of the second aspect of the embodiments of the present invention, the performing, by the processor, time-frequency compensation on the user terminal according to the time deviation estimated value and the frequency deviation estimated value includes at least one of the following cases: when the time deviation estimated value exceeds a first preset threshold (it may be considered that a large time deviation exists in a system), performing, by the processor, time compensation on the processor according to the time deviation estimated value; or when the frequency deviation estimated value exceeds a second preset threshold (it may be considered that a large frequency deviation exists in a system), performing, by the processor and based on the first frequency compensation, second frequency compensation on at least one of the oscillator, the processor, or the receiver according to the frequency deviation estimated value.

With reference to any one of the second aspect, or the first to the fifth possible implementation manners of the second aspect of the embodiments of the present invention, in a sixth possible implementation manner of the second aspect of the embodiments of the present invention, after performing the time-frequency compensation on the user terminal according to the time deviation estimated value and the frequency deviation estimated value, the processor is further configured to: receive, by using the receiver, a second PBCH signal sent by the serving cell; demodulate the second PBCH signal; if the second PBCH signal fails to be demodulated, determine that a time-frequency deviation remaining on the user terminal after the time-frequency compensation exceeds a third preset threshold, where the third preset threshold is a maximum time-frequency deviation allowed for maintaining normal communication by the user terminal; and control the user terminal to perform a network search. If the second PBCH signal fails to be demodulated, it indicates that a relatively large time-frequency deviation still remains in a system. The relatively large remaining time-frequency deviation causes user terminal system hanging. Therefore, the user terminal cannot perform normal communication. The user terminal is controlled to perform a network re-search, so that the user terminal is reset to an initial state, system hanging can be terminated, and normal communication of the user terminal is restored.

A third aspect of the embodiments of the present invention discloses a user terminal, including a module configured to perform the method and any possible implementation manner disclosed in the first aspect of the embodiments of the present invention.

In the embodiments of the present invention, a user terminal may measure a temperature of an oscillator on the user terminal when the user terminal is in a discontinuous reception DRX state, so as to obtain a temperature variation amount of the oscillator in a period of time from a sleep start moment to a sleep end moment in a DRX cycle of the DRX state; and may determine a frequency variation amount of the oscillator in the DRX cycle according to the temperature variation amount and a preset mapping relationship between the temperature and a frequency, and perform first frequency compensation on the user terminal according to the frequency variation amount of the oscillator. Further, the user terminal may determine whether the temperature variation amount exceeds a preset threshold, and if the temperature variation amount exceeds the preset threshold, consider that the temperature drastically varies. In this case, the user terminal may estimate a time deviation and a frequency deviation between the user terminal and a serving cell of the user terminal, so as to obtain a time deviation estimated value and a frequency deviation estimated value, and may perform time-frequency compensation on the user terminal according to the time deviation estimated value and the frequency deviation estimated value. It can be learned that, according to the embodiments of the present invention, a temperature compensation exception can be effectively identified by monitoring a temperature variation of the oscillator, and a time-frequency deviation caused by the temperature compensation exception is estimated and compensated in time, so that the user terminal can maintain normal communication.

BRIEF DESCRIPTION OF THE DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

The embodiments of the present invention disclose a time-frequency deviation compensation method and a user terminal. A temperature compensation exception can be effectively identified by monitoring a temperature variation of an oscillator, and a time-frequency deviation caused by the temperature compensation exception is estimated and compensated in real time, so that the user terminal can maintain normal communication. Details are described in the following separately.

Figure 1A:
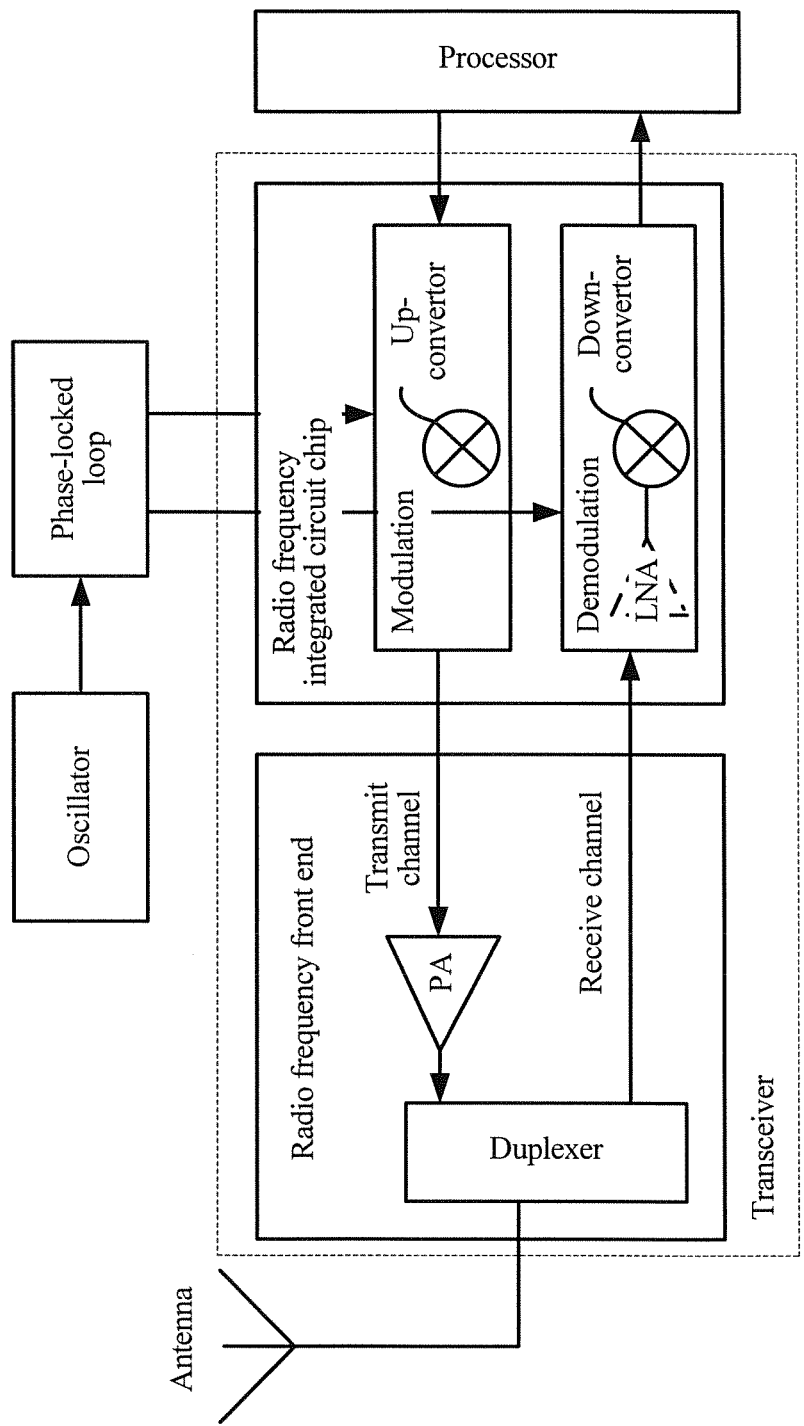
FIG. 1a is a schematic diagram of a system architecture of a user terminal disclosed in an embodiment of the present invention.

To better understand the embodiments of the present invention, the following first describes a system architecture of a user terminal disclosed in the embodiments of the present invention. Referring to FIG. 1a, FIG. 1a is a schematic diagram of a system architecture of a user terminal disclosed in an embodiment of the present invention. The user terminal may be further referred to as a mobile terminal, user equipment (User Equipment, UE for short), or the like, may specifically include various terminals such as a mobile phone, a palmtop computer, a tablet computer, a personal digital assistant (Personal Digital Assistant, PDA), a mobile Internet device (Mobile Internet Device, MID), or a wearable device (such as an intelligent watch, or an intelligent wristband). This embodiment of the present invention sets no limitation thereto. The system architecture of the user terminal shown in FIG. 1a may include at least an antenna, a radio frequency front end (Radio Frequency Front End, RFFE), a radio frequency integrated circuit (Radio Frequency Integrated Circuit, RFIC) chip, an oscillator, a phase-locked loop, and a processor. The processor may be an SOC (System on Chip, system on chip) chip that includes an application processor, a baseband processor, an image processor, and the like, or may be a baseband processor used only for baseband signal processing, an application-specific integrated circuit (Application Specific Integrated Circuit, ASIC), or the like. The radio frequency front end RFFE and the radio frequency integrated circuit RFIC chip form a transceiver (Transceiver) of the user terminal, and the transceiver is configured to modulate a sending signal from a baseband part and transmit the sending signal by using an antenna, or receive and demodulate an air interface signal, and then send the air interface signal to a baseband part for communications protocol processing.

The radio frequency front end RFFE may include at least a duplexer and a power amplifier (Power Amplifier, PA). The duplexer is mainly configured to couple both a transmit channel and a receive channel to an antenna, so that the antenna can send a signal, or receive a signal, or receive and send a signal. The PA is mainly configured to perform power amplification on a sending signal on a transmit channel, so that the sending signal can be sent by using an antenna.

The radio frequency integrated circuit RFIC chip is a modulation and demodulation unit following the radio frequency front end RFFE, and may include at least an up-converter and a down-converter. The up-converter is mainly configured to modulate a signal, that is, modulate a baseband low frequency signal to a high frequency signal on a transmit channel (that is, up-conversion). The down-converter is mainly configured to demodulate a signal, that is, demodulate a high frequency signal to a baseband signal on a receive channel (that is, down-conversion). The radio frequency integrated circuit RFIC chip may further include a low noise amplifier (Low Noise Amplifier, LNA), which is located in front of the down-converter (as shown in a dash line part in the figure), and is mainly configured to amplify a receiving signal.

The oscillator may be a crystal oscillator XO without temperature compensation, and may be configured to generate an oscillation frequency, and mix the oscillation frequency with the up-converter or the down-converter by using the phase-locked loop. The up/down-converter may be further referred to as a frequency mixer, and mix a high frequency signal with an oscillation signal generated by the oscillator to generate a baseband signal, or mix a baseband signal with an oscillation signal generated by the oscillator to generate a high frequency signal.

The processor is mainly configured to process a baseband signal according to a communications protocol, and may support communications protocols such as a GSM (Global System for Mobile communications, Global system for mobile communications), a UMTS (Universal Mobile Telecommunications System, Universal Mobile Telecommunications System), LTE (Long Term Evolution, LTE), CDMA (Code Division Multiple Access, Code Division Multiple Access), and the 5G (The 5th Generation Mobile Communication Technology, The 5th Generation Mobile Communication Technology). This embodiment of present invention sets no limitation thereto.

When the oscillator has no temperature compensation function, an output frequency of the oscillator deviates with a temperature variation. Therefore, a frequency deviation of the oscillator caused by the temperature variation needs to be estimated and compensated. When the user terminal is in a discontinuous reception DRX state, a temperature compensation module needs to be designed on the user terminal, so as to compensate the frequency deviation caused by the temperature variation. A temperature compensation method in this embodiment of the present invention may be implemented on the processor, and is used to estimate a frequency deviation parameter for the output frequency of the oscillator varying with the temperature, and perform frequency compensation on the oscillator, the processor, or a radio frequency part according to the frequency deviation parameter.

Figure 1B:
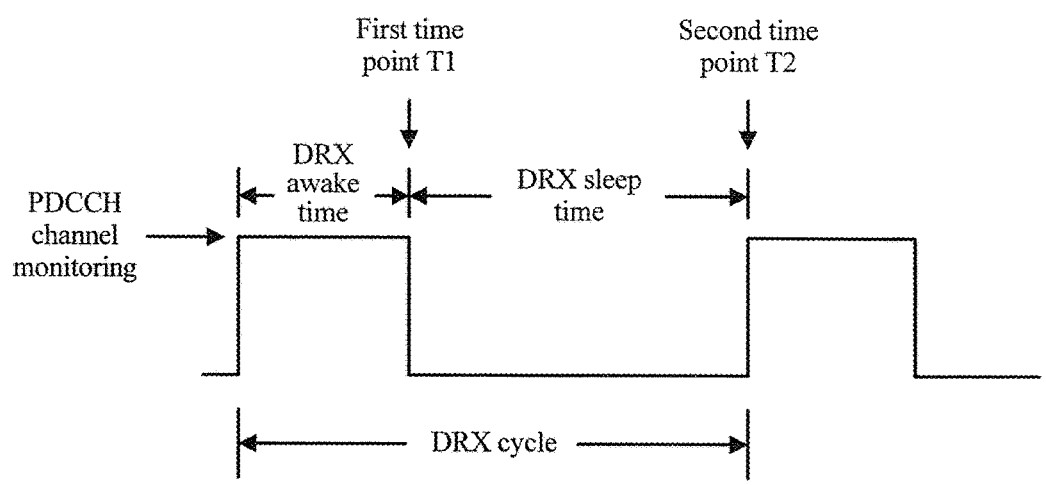
FIG. 1b is a schematic diagram of a DRX state of a user terminal disclosed in an embodiment of the present invention.

The following describes a discontinuous reception DRX state of the user terminal. Referring to FIG. 1b, FIG. 1b is a schematic diagram of the DRX state of the user terminal disclosed in an embodiment of the present invention.

A data stream based on a packet is generally unexpected, that is, in a period of time, data is transmitted, but in a next relatively long period of time, no data is transmitted. When no data is transmitted, power consumption may be reduced by stopping receiving a PDCCH (Physical Downlink Control Channel, physical downlink control channel), that is, in this case, PDCCH blind detection stops, so as to increase a battery use time. This is a meaning of DRX.

A basic mechanism of the DRX is configuring a DRX cycle (Cycle) for a user terminal that is in an RRC_CONNECTED state. The DRX cycle may include a DRX awake time (or an "On Duration" time) and a DRX sleep time (or an "Opportunity for DRX" time). In the "On Duration" time, the user terminal monitors and receives a PDCCH (an active period), and in the "Opportunity for DRX" time, the user terminal does not receive a PDCCH to reduce power consumption (a sleep period).

It may be learned from FIG. 1b that, in a time domain, time is divided into successive DRX cycles.

It should be noted that, a user terminal in the sleep period does not receive only PDCCH data, but may receive data, an ACK/NACK (Acknowledgement/Negative Acknowledgment, Acknowledgement/Negative Acknowledgment), or the like from another physical channel, for example, a PDSCH (Physical Downlink Shared Channel, physical downlink shared channel). For example, in SPS (Semi-Persistent Scheduling, semi-persistent scheduling), a user terminal in the sleep period may receive PDSCH data sent on a downlink subframe that is periodically configured.

Figure 2:
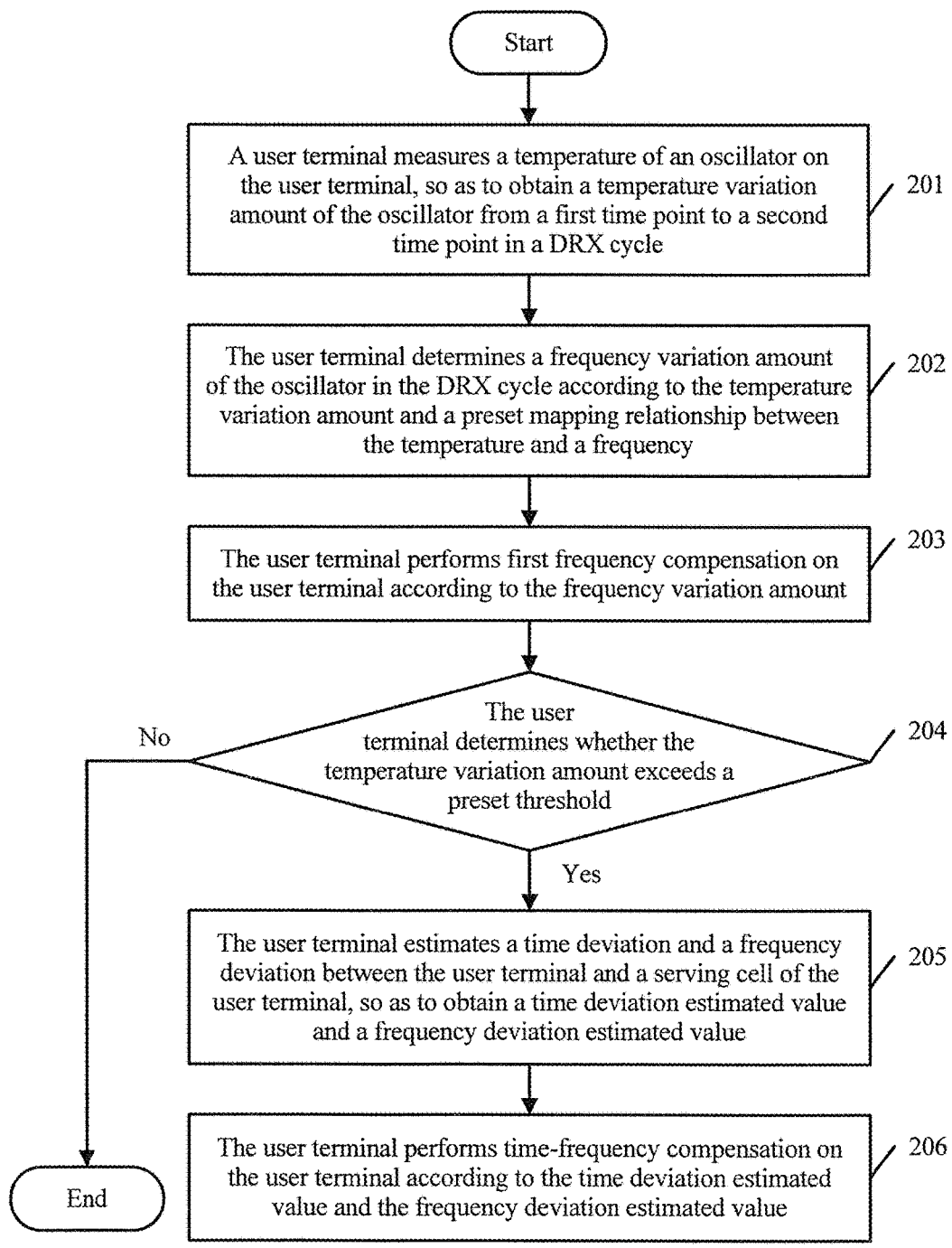
FIG. 2 is a schematic flowchart of a time-frequency deviation compensation method disclosed in an embodiment of the present invention.

Based on the system architecture of a user terminal shown in FIG. 1a, an embodiment of the present invention discloses a time-frequency deviation compensation method. Referring to FIG. 2, FIG. 2 is a schematic flowchart of a time-frequency deviation compensation method disclosed in an embodiment of the present invention. The time-frequency deviation compensation method may be applied to a user terminal in a discontinuous reception DRX state. As shown in FIG. 2, the time-frequency deviation compensation method may include the following steps.

201. A user terminal measures a temperature of an oscillator on the user terminal, so as to obtain a temperature variation amount of the oscillator from a first time point to a second time point in a DRX cycle.

In this embodiment of the present invention, when the user terminal is in a DRX state, it may be first determined whether DRX is in an IDLE (sleep or idle) state or an awake state. When the DRX is in the sleep state, the user terminal closes a radio frequency part and does not receive a signal delivered on a PDCCH channel, and enters a low power consumption state. When the DRX is waked up, the user terminal may determine whether there is a communication service (for example, whether there is a calling). When there is a communication service, the user terminal ends the DRX state and enters a normal working state. A system message delivered by a base station to which the user terminal is currently connected may carry a maximum time of each sleep of the user terminal. In addition, the user terminal may determine whether the DRX needs to be waked up more frequently.

In this embodiment of the present invention, the user terminal may measure the temperature of the oscillator on the user terminal when being in a DRX state, so as to obtain the temperature variation amount of the oscillator from the first time point to the second time point in the DRX cycle. The first time point is a sleep start moment in the DRX cycle, that is, a first time point T1 shown in FIG. 1b. The second time point is a sleep end moment (that is, a moment at which the DRX starts to be waked up) in the DRX cycle, that is, a second time point T2 shown in FIG. 1b. When being in a DRX state, the user terminal may periodically switch the DRX from the sleep state to the awake state. The first time point and the second time point refer to the DRX sleep start moment and the sleep end moment that are in the same DRX cycle. When being in a DRX state, the user terminal may measure the temperature of the oscillator on the user terminal in real time, or may separately measure the temperature of the oscillator on the user terminal at the first time point and the second time point. This embodiment of the present invention sets no limitation thereto. The oscillator herein may be a crystal oscillator such as a voltage controlled oscillator (Voltage Controlled Oscillator, VCO), or a numerically controlled oscillator (Numerically Controlled Oscillator, NCO).

In this embodiment of the present invention, the temperature variation amount may be an absolute difference between temperatures of the oscillator that are corresponding to any two moments in a period of time from the first time point to the second time point in the DRX cycle, for example, an absolute difference between a temperature of the oscillator measured when the DRX starts sleeping and a temperature measured when the DRX ends sleeping; or may be a temperature variation rate of the oscillator in a period of time from the first time point to the second time point in the DRX cycle; or the like. This embodiment of the present invention sets no limitation thereto.

As an optional implementation manner, a specific implementation manner of step 201 in which a user terminal measures a temperature of an oscillator on the user terminal, so as to obtain a temperature variation amount of the oscillator from a first time point to a second time point in a DRX cycle may include the following step:

(21) The user terminal measures the temperature of the oscillator on the user terminal by using a thermistor, so as to obtain the temperature variation amount of the oscillator from the first time point to the second time point in the DRX cycle.

In this implementation manner, when being in a DRX state, the user terminal may measure the temperature of the oscillator by using the thermistor on the user terminal. Specifically, the temperature of the oscillator may be estimated according to a voltage variation at two ends of the thermistor. Because a voltage of the thermistor varies with a temperature, a correspondence between a voltage and a temperature may be pre-stored on the user terminal, so as to obtain the temperature of the oscillator according to the correspondence.

As an optional implementation manner, a specific implementation manner of step 201 in which a user terminal measures a temperature of an oscillator on the user terminal, so as to obtain a temperature variation amount of the oscillator from a first time point to a second time point in a DRX cycle may further include the following step:

(22) The user terminal measures the temperature of the oscillator on the user terminal by using a temperature sensor, so as to obtain the temperature variation amount of the oscillator from the first time point to the second time point in the DRX cycle.

In this implementation manner, when being in a DRX state, the user terminal may measure the temperature of the oscillator by using one or more temperature sensors integrated into the user terminal. Specifically, the user terminal may directly read the temperature of the oscillator by using the temperature sensor.

It can be understood that, when being in a DRX state, in addition to using a thermistor or a temperature sensor to measure the temperature of the oscillator, the user terminal may further measure the temperature of the oscillator in another manner, such as an infrared thermometer. This embodiment of the present invention sets no limitation thereto.

202. The user terminal determines a frequency variation amount of the oscillator in the DRX cycle according to the temperature variation amount and a preset mapping relationship between the temperature and a frequency.

203. The user terminal performs first frequency compensation on the user terminal according to the frequency variation amount.

In this embodiment of the present invention, because an output frequency of the oscillator varies with a temperature, the mapping relationship between the temperature and the frequency of the oscillator may be pre-stored on the user terminal, and different temperatures may correspond to different frequencies.

In this embodiment of the present invention, after measuring the temperature variation amount of the oscillator when the user terminal is in a DRX state, the user terminal may estimate, according to the temperature variation amount and the preset mapping relationship between the temperature and the frequency, the frequency variation amount of the oscillator in the DRX cycle caused by the temperature variation, and may perform frequency compensation on the user terminal according to the frequency variation amount. For example, the user terminal may perform frequency compensation on at least one of the oscillator, a baseband, or a radio frequency part of the user terminal according to the frequency variation amount. The frequency variation amount herein may be a difference between frequencies corresponding to two temperatures.

As an optional implementation manner, a specific implementation manner in which the user terminal performs first frequency compensation on the oscillator of the user terminal according to the frequency variation amount of the oscillator may be implementing the frequency compensation by controlling a voltage of the oscillator, that is, controlling the voltage of the oscillator according to the frequency variation amount of the oscillator and a preset correspondence between the voltage and the frequency, so as to implement the frequency compensation.

As an optional implementation manner, a specific implementation manner in which the user terminal performs first frequency compensation on the baseband of the user terminal according to the frequency variation amount of the oscillator may be: calculating a phase $\Delta\theta=2\pi\Delta f/f_{sampling}$ of each sampling point for the frequency variation amount $\Delta f$ at an AD sampling rate, where $f_{sampling}$ is a sampling rate of AD (analog-to-digital conversion: A processor receives an analog baseband signal output by a down-converter, and converts the analog baseband signal to a digital signal), and compensating for the phase of each sampling point (multiplying a sampling point i by $e^{-\Delta\theta\times i}$), so as to implement the frequency compensation by changing a frequency of each digital sampling point signal by adjusting a phase of each digital sampling point signal.

As an optional implementation manner, a specific implementation manner in which the user terminal performs first frequency compensation on the radio frequency of the user terminal according to the frequency variation amount of the oscillator may be implementing frequency error calibration by adjusting a PLL (Phase Locked Loop, phase-locked loop) coefficient or directly adjusting the frequency of the oscillator.

204. The user terminal determines whether the temperature variation amount exceeds a preset threshold, and if the temperature variation amount exceeds the preset threshold, step 205 is performed; or if the temperature variation amount does not exceed the preset threshold, a current operation ends.

In this embodiment of the present invention, after measuring the temperature variation amount of the oscillator when the user terminal is in a DRX state, the user terminal may determine whether the temperature variation amount exceeds the preset threshold. If the temperature variation amount exceeds the preset threshold, it may be considered that the temperature of the oscillator drastically varies. There are various factors causing a drastic variation in the temperature of the oscillator. For example, the drastic variation may be caused by a factor such as an environment temperature (for example, entering the outdoors with a relatively high temperature from the indoors with a relatively low temperature). The drastic variation in the temperature of the oscillator may cause an excessively large time-frequency deviation remaining in a system. Consequently, the system cannot perform normal communication, and thereby causing a temperature compensation exception. The preset threshold may be pre-stored on the user terminal, and may be a default setting that cannot be changed, or may be modified according to an actual need. Step 205 may be subsequently performed when the temperature variation amount exceeds the preset threshold. The current operation may be ended when the temperature variation amount does not exceed the preset threshold; in this case, the user terminal may measure the temperature of the oscillator again.

205. The user terminal estimates a time deviation and a frequency deviation between the user terminal and a serving cell of the user terminal, so as to obtain a time deviation estimated value and a frequency deviation estimated value.

In this embodiment of the present invention, when the temperature variation amount exceeds the preset threshold, that is, when the temperature of the oscillator drastically varies, the user terminal may further estimate the time deviation and the frequency deviation between the user terminal and the serving cell of the user terminal. The serving cell of the user terminal is a cell on which the user terminal currently camps, that is, a cell to which the user terminal is currently connected. The time deviation estimated value is the time deviation between the user terminal and the serving cell, and the frequency deviation estimated value is the frequency deviation between the user terminal and the serving cell.

In this embodiment of the present invention, there are various methods for estimating, by the user terminal, the time deviation and the frequency deviation between the user terminal and the serving cell of the user terminal. For example, the time deviation and the frequency deviation between the user terminal and the serving cell of the user terminal may be estimated by periodically enabling a cell search and by using a primary synchronization signal PSS and a secondary synchronization signal SSS; or the time deviation and the frequency deviation between the user terminal and the serving cell of the user terminal may be estimated by using a symbol that carries a physical broadcast channel PBCH. This embodiment of the present invention sets no limitation thereto.

206. The user terminal performs time-frequency compensation on the user terminal according to the time deviation estimated value and the frequency deviation estimated value.

In this embodiment of the present invention, the time-frequency compensation may include at least one of time compensation or frequency compensation. The user terminal may perform time compensation on the baseband part of the user terminal according to the time deviation estimated value, and the user terminal may perform frequency compensation on at least one of the oscillator, the baseband, or the radio frequency part of the user terminal according to the frequency deviation estimated value.

In the method described in FIG. 2, a user terminal may measure a temperature of an oscillator on the user terminal when the user terminal is in a DRX state, so as to obtain a temperature variation amount of the oscillator in a period of time from a sleep start moment to a sleep end moment of the DRX state in a DRX cycle; and may determine a frequency variation amount of the oscillator in the DRX cycle according to the temperature variation amount and a preset mapping relationship between the temperature and a frequency, and perform first frequency compensation on the user terminal according to the frequency variation amount of the oscillator. Further, the user terminal may determine whether the temperature variation amount exceeds a preset threshold, and if the temperature variation amount exceeds the preset threshold, consider that the temperature drastically varies. In this case, the user terminal may estimate a time deviation and a frequency deviation between the user terminal and a serving cell of the user terminal, so as to obtain a time deviation estimated value and a frequency deviation estimated value, and may perform time-frequency compensation on the user terminal according to the time deviation estimated value and the frequency deviation estimated value. According to the method described in FIG. 2, a temperature compensation exception can be effectively identified by monitoring a temperature variation of the oscillator, and a time-frequency deviation caused by the temperature compensation exception is estimated and compensated in time, so that the user terminal can maintain normal communication.

Figure 3A:
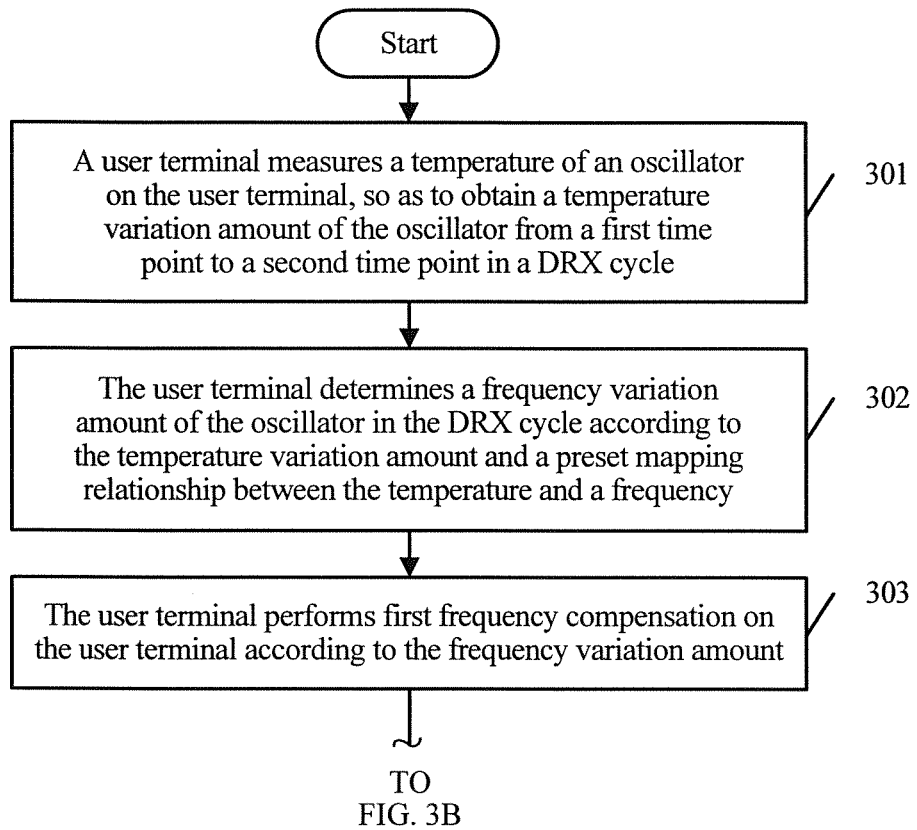
FIG. 3A and FIG. 3B are a schematic flowchart of another time-frequency deviation compensation method disclosed in an embodiment of the present invention.
Figure 3B:
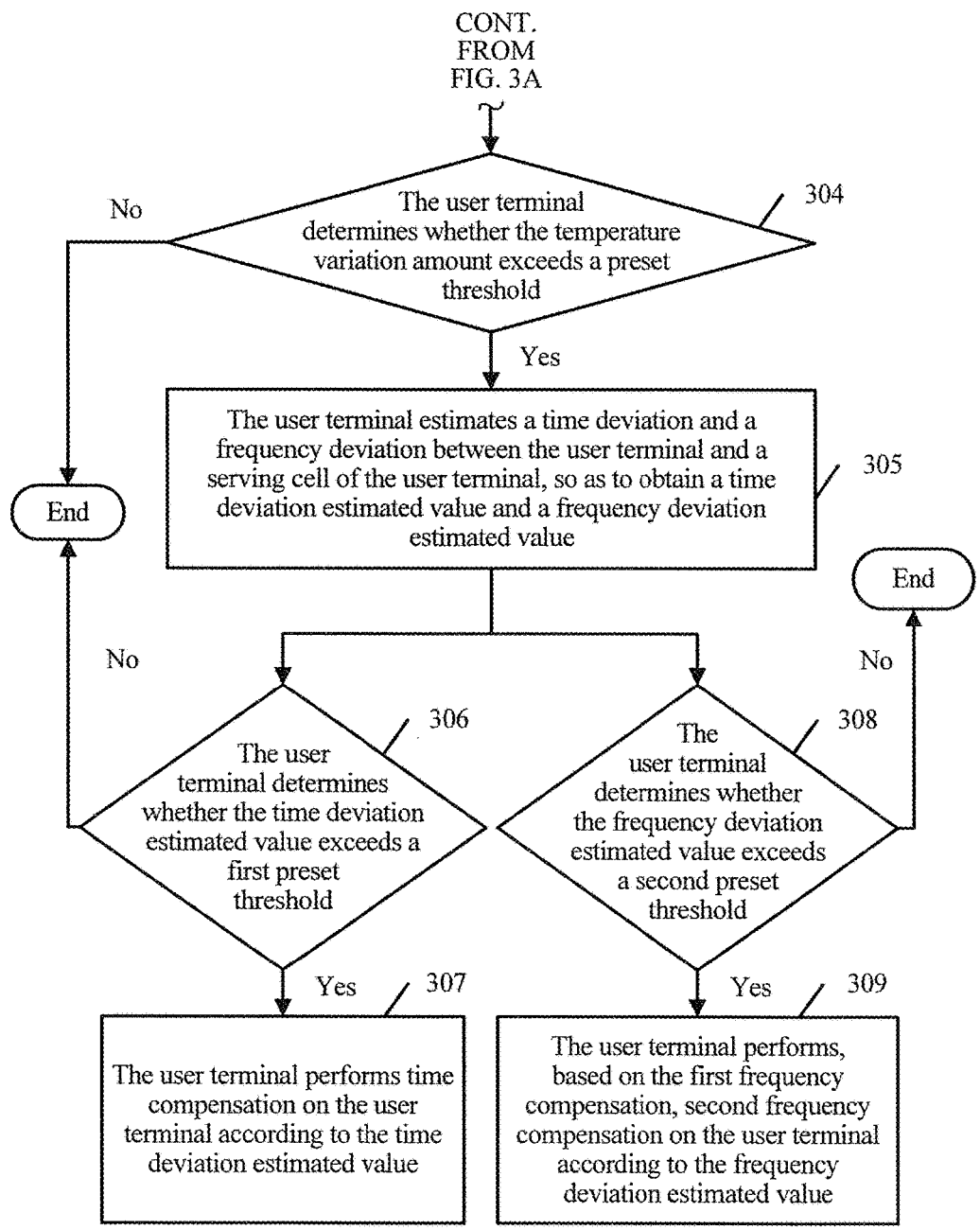

Based on the system architecture of the user terminal shown in FIG. 1a, an embodiment of the present invention discloses another time-frequency deviation compensation method. The time-frequency deviation compensation method may be applied to a user terminal in a discontinuous reception DRX state. Referring to FIG. 3A and FIG. 3B, FIG. 3A and FIG. 3B are a schematic flowchart of another time-frequency deviation compensation method disclosed in an embodiment of the present invention. As shown in FIG. 3A and FIG. 3B, the time-frequency deviation compensation method may include the following steps.

301. A user terminal measures a temperature of an oscillator on the user terminal, so as to obtain a temperature variation amount of the oscillator from a first time point to a second time point in a DRX cycle.

In this embodiment of the present invention, the first time point is a sleep start moment in the DRX cycle, and the second time point is a sleep end moment (that is, a moment at which the DRX starts to be waked up) in the DRX cycle. The temperature variation amount may be an absolute difference between temperatures of the oscillator that are corresponding to any two moments in a period of time from the first time point to the second time point in the DRX cycle, or may be a temperature variation rate in the period of time, or the like. This embodiment of the present invention sets no limitation thereto.

As an optional implementation manner, a specific implementation manner of step 301 in which a user terminal measures a temperature of an oscillator on the user terminal, so as to obtain a temperature variation amount of the oscillator from a first time point to a second time point in a DRX cycle may include the following steps:

(31) The user terminal measures the temperature of the oscillator on the user terminal, and obtains a first temperature of the oscillator at the first time point and a second temperature of the oscillator at the second time point.

(32) The user terminal calculates a first absolute difference between the first temperature and the second temperature, and uses the first absolute difference as the temperature variation amount.

In this implementation manner, when the user terminal is in a DRX state, a temperature of the oscillator measured at the DRX state sleep start moment in the DRX cycle is used as the first temperature, and a temperature of the oscillator measured at the DRX state sleep end (that is, being waked up) moment in the DRX cycle is used as the second temperature. In this case, the temperature variation amount is an absolute difference between a temperature of the oscillator at the DRX state sleep start moment and a temperature of the oscillator at the DRX state sleep end moment.

302. The user terminal determines a frequency variation amount of the oscillator in the DRX cycle according to the temperature variation amount and a preset mapping relationship between the temperature and a frequency.

303. The user terminal performs first frequency compensation on the user terminal according to the frequency variation amount.

In this embodiment of the present invention, the user terminal may perform first frequency compensation on at least one of the oscillator, a baseband, or a radio frequency part of the user terminal according to the frequency variation amount.

As an optional implementation manner, a specific implementation manner of step 302 in which the user terminal determines a frequency variation amount of the oscillator in the DRX cycle according to the temperature variation amount and a preset mapping relationship between the temperature and a frequency may include the following steps:

(33) The user terminal obtains, according to the pre-stored mapping relationship between the temperature and a frequency, a first frequency corresponding to the first temperature of the oscillator at the first time point and a second frequency corresponding to the second temperature of the oscillator at the second time point.

(34) The user terminal calculates a second absolute difference between the first frequency and the second frequency, and determines the second absolute difference as the frequency variation amount of the oscillator.

In this implementation manner, because an output frequency of the oscillator varies with a temperature, the mapping relationship between the temperature of the oscillator and a frequency may be pre-stored on the user terminal. The user terminal may obtain the first frequency corresponding to the first temperature and the second frequency corresponding to the second temperature from the mapping relationship, and uses the absolute difference between the first frequency and the second frequency as the frequency variation amount of the oscillator.

304. The user terminal determines whether the temperature variation amount exceeds a preset threshold, and if the temperature variation amount exceeds the preset threshold, step 305 is performed; or if the temperature variation amount does not exceed the preset threshold, a current operation ends.

In this embodiment of the present invention, if the temperature variation amount exceeds the preset threshold pre-stored on the user terminal, it indicates that the temperature of the oscillator drastically varies. Drastic temperature variation may cause an oscillator temperature compensation exception (for example, a relatively large frequency deviation still remains in a system). In this case, step 305 is further performed. If the temperature variation amount does not exceed the preset threshold, it may be considered that the temperature of the oscillator slightly varies, that is, a frequency deviation of the oscillator caused by a temperature variation is relatively small. In this case, the user terminal may still work normally when the frequency deviation is small, and perform various services during a DRX awake period, for example, demodulation paging.

305. The user terminal estimates a time deviation and a frequency deviation between the user terminal and a serving cell of the user terminal, so as to obtain a time deviation estimated value and a frequency deviation estimated value.

As an optional implementation manner, a specific implementation manner of step 305 in which the user terminal estimates a time deviation and a frequency deviation between the user terminal and a serving cell of the user terminal, so as to obtain a time deviation estimated value and a frequency deviation estimated value may include the following step:

(35) The user terminal enables a cell search every preset time to determine the time deviation and the frequency deviation between the user terminal and the serving cell of the user terminal, so as to obtain the time deviation estimated value and the frequency deviation estimated value.

In this implementation manner, when detecting that the temperature varies drastically, the user terminal may periodically enable the cell search, so as to monitor the time deviation and the frequency deviation between the user terminal and the serving cell. A purpose of the cell reach is to synchronize time and frequency of the user terminal and the serving cell.

In this implementation manner, the preset time may be determined according to a temperature range to which a current temperature of the oscillator belongs and a preset correspondence. The preset correspondence includes a correspondence between multiple temperature ranges and at least one time value. Different temperature ranges may correspond to different preset times, or multiple temperature ranges may correspond to a same preset time. The cell search is more frequently enabled in a high temperature range and a low temperature range, and the preset time may be 1.28 seconds, 2.56 seconds, or the like.

As an optional implementation manner, a specific implementation manner of step (35) in which the user terminal enables a cell search every preset time to determine the time deviation and the frequency deviation between the user terminal and the serving cell of the user terminal, so as to obtain the time deviation estimated value and the frequency deviation estimated value may include the following steps:

(36) The user terminal receives, every the preset time, a first primary synchronization signal PSS and a first secondary synchronization signal SSS in communication between the user terminal and the serving cell.

(37) The user terminal separately performs cross-correlation processing between the first PSS and a pre-stored second PSS and between the first SSS and a pre-stored second SSS, so as to determine the time deviation between the user terminal and the serving cell, and uses the time deviation as the time deviation estimated value.

(38) The user terminal separately adjusts the first PSS and the first SSS according to the time deviation estimated value, to obtain a third PSS and a third SSS.

(39) The user terminal separately performs conjugate processing between the third PSS and the pre-stored second PSS and between the third SSS and the pre-stored second SSS, so as to determine the frequency deviation between the user terminal and the serving cell, and uses the frequency deviation as the frequency deviation estimated value.

In this implementation manner, sliding cross-correlation processing is separately performed between the first PSS received by the user terminal and the locally pre-stored second PSS and between the first SSS received by the user terminal and the pre-stored second SSS (a cell physical ID of the serving cell is known, the locally pre-stored second PSS and second SSS may be determined according to the cell physical ID, and therefore are also known). A sliding location corresponding to a maximum correlation value is obtained, and the time deviation is calculated according to the sliding location. Point-by-point conjugate multiplying processing is separately performed between the received first PSS/first SSS and the locally pre-stored second PSS/pre-stored second SSS after the received first PSS/first SSS are adjusted according to the foregoing estimated time deviation. The frequency deviation is estimated by comparing phase differences between points after the conjugate multiplying. The separately adjusting the first PSS and the first SSS may be specifically: picking a value of the first PSS starting from the sliding location, and forming the third PSS by using picked 128 values; and picking a value of the first SSS starting from the sliding location, and forming the third SSS.

As an optional implementation manner, a specific implementation manner of step 305 in which the user terminal estimates a time deviation and a frequency deviation between the user terminal and a serving cell of the user terminal, so as to obtain a time deviation estimated value and a frequency deviation estimated value may further include the following steps:

(40) The user terminal receives a first physical broadcast channel PBCH signal sent by the serving cell of the user terminal.

(41) The user terminal performs cross-correlation processing between the first PBCH signal and a pre-stored PBCH signal, so as to determine the time deviation between the user terminal and the serving cell, and uses the time deviation as the time deviation estimated value.

(42) The user terminal adjusts the first PBCH signal according to the time deviation estimated value.

(43) The user terminal performs conjugate processing between the adjusted first PBCH signal and the pre-stored PBCH signal, so as to determine the frequency deviation between the user terminal and the serving cell, and uses the frequency deviation as the frequency deviation estimated value.

In this implementation manner, the first PBCH signal is transmitted on a PBCH channel, and is carried on first four symbols in the second time slot of the first subframe of a data frame. Because the user terminal camps on the serving cell, information included on the PBCH is known to the user terminal, and a local PBCH signal, that is, the pre-stored PBCH signal, may be generated. Sliding correlation processing is performed between the pre-stored PBCH signal and the received first PBCH signal to estimate the time deviation. The first PBCH signal is adjusted according to a sliding location. Point-by-point conjugate multiplying is performed between the location-adjusted first PBCH signal and the pre-stored PBCH signal, and the frequency deviation is estimated by comparing phase differences.

306. The user terminal determines whether the time deviation estimated value exceeds a first preset threshold, and if the time deviation estimated value exceeds the first preset threshold, step 307 is performed; or if the time deviation estimated value does not exceed the first preset threshold, the current operation ends.

In this embodiment of the present invention, when the time deviation estimated value exceeds the first preset threshold pre-stored on the user terminal, it may be considered that there is a relatively large time deviation between the user terminal and the serving cell. For example, there is a relatively large deviation between a frame header location maintained by the user terminal and an ideal frame header location. In this case, step 307 is further performed. When the time deviation estimated value is less than the first preset threshold, it may be considered that the time deviation between the user terminal and the serving cell is in an acceptable range.

307. The user terminal performs time compensation on the user terminal according to the time deviation estimated value.

In this embodiment of the present invention, when there is a relatively large time deviation between the user terminal and the serving cell, the user terminal may perform time compensation on the user terminal according to the time deviation estimated value. Specifically, the user terminal may perform time compensation on the baseband part of the user terminal according to the time deviation estimated value, so as to synchronize time of the user terminal and the serving cell.

As an optional implementation manner, the time deviation estimated value may be represented as a channel time delay. A specific implementation manner in which the user terminal performs time compensation on the baseband part of the user terminal according to the time deviation estimated value may be as follows: It is assumed that an ideal timing (a time deviation is zero) time domain digital signal is x(n), where n is a sampling point index, and a corresponding frequency domain digital signal is X(k), where k is a subcarrier index; if a timing deviation (that is, the time deviation estimated value) of a signal x'(n) received by the user terminal is v, that is, x'(n)=x(n+v), CP (Cyclic Prefix, cyclic prefix) remove processing is performed on the signal x'(n) with a timing deviation according to the time deviation estimated value, and then FFT (Fast Fourier Transform, Fast Fourier Transform) is performed on the signal x'(n), so as to obtain a corresponding frequency domain digital signal:

$$X'(k) = X(k)e^{j\frac{2\pi kv}{N}};$$

and an ideal timing (that is, time compensation is completed) frequency domain digital signal X(k) may be obtained by multiplying X'(k) by $$e^{-j\frac{2\pi kv}{N}},$$

so as to implement the time compensation.

308. The user terminal determines whether the frequency deviation estimated value exceeds a second preset threshold, and if the frequency deviation estimated value exceeds the second preset threshold, step 309 is performed; or if the frequency deviation estimated value does not exceed the second preset threshold, the current operation ends.

In this embodiment of the present invention, when the frequency deviation estimated value exceeds the second preset threshold pre-stored on the user terminal, it may be considered that there is a relatively large frequency deviation between the user terminal and the serving cell. In this case, step 309 may be further performed. When the frequency deviation estimated value is less than the second preset threshold, it may be considered that the frequency deviation between the user terminal and the serving cell is in an acceptable range.

309. The user terminal performs, based on the first frequency compensation, second frequency compensation on the user terminal according to the frequency deviation estimated value.

In this embodiment of the present invention, when there is a relatively large frequency deviation between the user terminal and the serving cell, the user terminal may perform, based on the first frequency compensation, second frequency compensation on the user terminal according to the frequency deviation estimated value. Specifically, the user terminal may perform, based on the first frequency compensation, second frequency compensation on at least one of the oscillator, the baseband, or the radio frequency part of the user terminal according to the frequency deviation estimated value, so as to synchronize frequency of the user terminal and the serving cell. A method for performing second frequency compensation on the user terminal is the same as the foregoing method used for performing the first frequency compensation, and is not described herein.

In this embodiment of the present invention, time and frequency of the user terminal and the serving cell are synchronized by performing time compensation and/or frequency compensation on the user terminal, so that the user terminal can perform normal communication.

As an optional implementation manner, after the user terminal performs time-frequency compensation, the method described in FIG. 3A and FIG. 3B may further include the following steps:

(44) The user terminal receives a second PBCH signal sent by the serving cell.

(45) The user terminal demodulates the second PBCH signal.

(46) If the second PBCH signal fails to be demodulated, it is determined that a time-frequency deviation remaining on the user terminal after the time-frequency compensation exceeds a third preset threshold, where the third preset threshold is a maximum time-frequency deviation allowed for maintaining normal communication by the user terminal.

(47) The user terminal performs a network search.

In this implementation manner, the user terminal may demodulate a PBCH signal (that is, the second PBCH signal) received after the time-frequency compensation, and check, by using a cyclic redundancy check (Cyclic Redundancy Check, CRC) code, whether the signal is successfully demodulated. When demodulation fails, it may be determined that the time-frequency deviation remaining on the user terminal after the time-frequency compensation exceeds the third preset threshold. In this case, it indicates that a relatively large time-frequency deviation still remains in a user terminal system. A communication exception will occur on the user terminal when a relatively large time-frequency deviation remains. The third preset threshold is the maximum acceptable time-frequency deviation allowed for maintaining normal communication by the user terminal. A communication exception occurs on the user terminal when the remaining time-frequency deviation exceeds the maximum value. When demodulation succeeds, DRX may enter a sleep state again. A time-frequency deviation of a signal is estimated after temperature compensation, and the signal is demodulated by using a PBCH, so as to determine whether a current working status of the user terminal is abnormal.

In this implementation manner, when the user terminal fails to demodulate the second PBCH signal, the user terminal may respond to this demodulation operation in time, and enable a network search; or the user terminal may not immediately enable a network search, but may be triggered to enable a network search again after detecting, for N (N is a positive integer) consecutive times, that the second PBCH signal fails to be demodulated, so as to reduce an erroneous determining probability.

In this implementation manner, the user terminal is controlled to perform a network search, so that the user terminal can be reset and restored to an initial state. Therefore, a system hanging problem of the user terminal caused by a relatively large time-frequency deviation may be resolved. In addition, a network re-search may further trigger the user terminal to enable a cell search operation again.

In this embodiment of the present invention, according to the method described in FIG. 3A and FIG. 3B, a temperature compensation exception can be effectively identified by monitoring a temperature variation of an oscillator, and a time-frequency deviation caused by the temperature compensation exception is estimated and compensated in time, so that a user terminal can maintain normal communication. Further, when a time-frequency deviation remaining in a system after temperature compensation is within an estimation capability, the user terminal can still work normally; or when a time-frequency deviation remaining in a system after temperature compensation is relatively large and exceeds an estimation capability, such situation can be detected, and system hanging is terminated by means of a network re-search, so that normal communication of the user terminal is restored, and the user terminal is protected.

Figure 4:
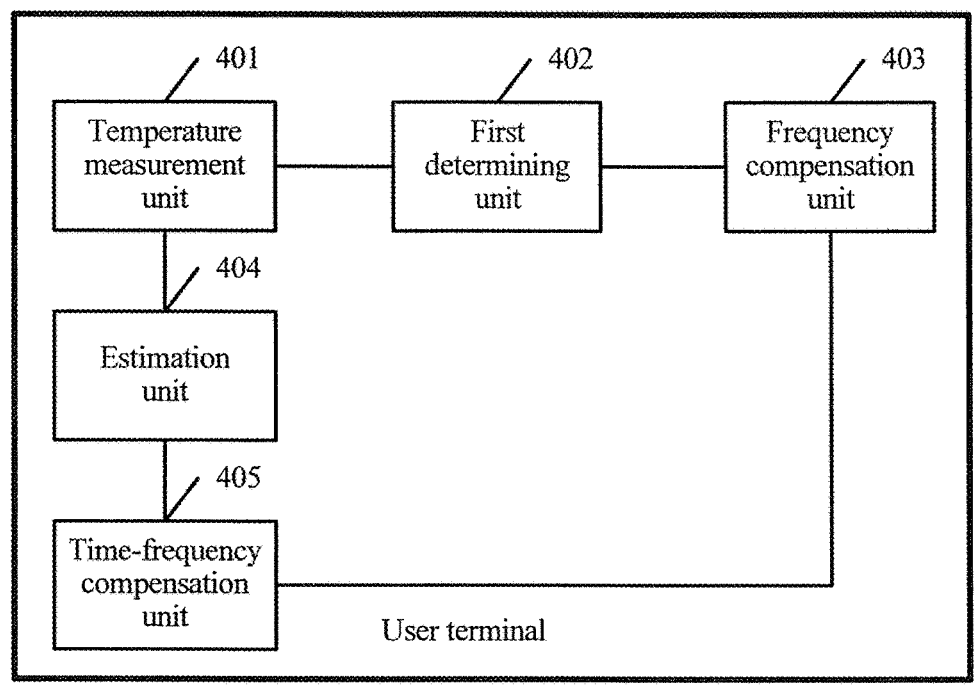
FIG. 4 is a schematic structural diagram of a user terminal disclosed in an embodiment of the present invention.

Referring to FIG. 4, FIG. 4 is a schematic structural diagram of a user terminal disclosed in an embodiment of the present invention, and the user terminal may be configured to perform the time-frequency deviation compensation method disclosed in the embodiments of the present invention. As shown in FIG. 4, the user terminal may include a temperature measurement unit 401, a first determining unit 402, a frequency compensation unit 403, an estimation unit 404, and a time-frequency compensation unit 405.

The temperature measurement unit 401 is configured to measure a temperature of an oscillator on the user terminal when the user terminal is in a discontinuous reception DRX state, so as to obtain a temperature variation amount of the oscillator from a first time point to a second time point in a DRX cycle.

In this embodiment of the present invention, the temperature measurement unit 401 may measure the temperature of the oscillator on the user terminal when the user terminal is in a DRX state, so as to obtain the temperature variation amount of the oscillator from the first time point to the second time point in the DRX cycle. The first time point is a sleep start moment in the DRX cycle, and the second time point is a sleep end moment in the DRX cycle. When the user terminal is in a DRX state, the temperature measurement unit 401 may measure the temperature of the oscillator on the user terminal in real time, or may measure the temperature of the oscillator at the first time point and the second time point. This embodiment of the present invention sets no limitation thereto.

In this embodiment of the present invention, the temperature variation amount may be an absolute difference between temperatures of the oscillator that are corresponding to any two moments in a period of time from the first time point to the second time point in the DRX cycle; or may be a temperature variation rate of the oscillator in a period of time from the first time point to the second time point in the DRX cycle; or the like. This embodiment of the present invention sets no limitation thereto.

As an optional implementation manner, when the user terminal is in a discontinuous reception DRX state, the temperature measurement unit 401 may measure the temperature of the oscillator on the user terminal by using a thermistor, so as to obtain the temperature variation amount of the oscillator from the first time point to the second time point in the DRX cycle.

As an optional implementation manner, when the user terminal is in a discontinuous reception DRX state, the temperature measurement unit 401 may measure the temperature of the oscillator on the user terminal by using a temperature sensor, so as to obtain the temperature variation amount of the oscillator from the first time point to the second time point in the DRX cycle.

The first determining unit 402 is configured to determine a frequency variation amount of the oscillator in the DRX cycle according to the temperature variation amount and a preset mapping relationship between the temperature and a frequency.

The frequency compensation unit 403 is configured to perform first frequency compensation on the user terminal according to the frequency variation amount.

In this embodiment of the present invention, the frequency compensation unit 403 may be specifically configured to perform first frequency compensation on at least one of the oscillator, a baseband, or a radio frequency part of the user terminal according to the frequency variation amount of the oscillator.

The estimation unit 404 is configured to estimate a time deviation and a frequency deviation between the user terminal and a serving cell of the user terminal when the temperature variation amount exceeds a preset threshold, so as to obtain a time deviation estimated value and a frequency deviation estimated value.

In this embodiment of the present invention, when the temperature variation amount measured by the temperature measurement unit 401 exceeds the preset threshold pre-stored on the user terminal, it may be considered that the temperature of the oscillator drastically varies. Therefore, the estimation unit 404 may estimate the time deviation and the frequency deviation between the user terminal and the serving cell of the user terminal, so as to obtain the time deviation estimated value and the frequency deviation estimated value. The serving cell of the user terminal is a cell on which the user terminal currently camps, that is, a cell to which the user terminal is currently connected.

The time-frequency compensation unit 405 is configured to perform time-frequency compensation on the user terminal according to the time deviation estimated value and the frequency deviation estimated value.

As an optional implementation manner, a specific implementation manner in which the time-frequency compensation unit 405 performs time-frequency compensation on the user terminal according to the time deviation estimated value and the frequency deviation estimated value may include at least one of the following cases:

when the time deviation estimated value exceeds a first preset threshold, the time-frequency compensation unit 405 performs time compensation on the baseband part of the user terminal according to the time deviation estimated value; or when the frequency deviation estimated value exceeds a second preset threshold, the time-frequency compensation unit 405 performs, based on the first frequency compensation, second frequency compensation on at least one of the oscillator, the baseband, or the radio frequency part of the user terminal according to the frequency deviation estimated value.

As an optional implementation manner, a specific implementation manner in which the estimation unit 404 estimates a time deviation and a frequency deviation between the user terminal and a serving cell of the user terminal, so as to obtain a time deviation estimated value and a frequency deviation estimated value may include:

the estimation unit 404 enables a cell search every preset time to determine the time deviation and the frequency deviation between the user terminal and the serving cell of the user terminal, so as to obtain the time deviation estimated value and the frequency deviation estimated value.

The cell search is periodically enabled to monitor the time deviation and the frequency deviation between the user terminal and the serving cell. The preset time is a period for enabling the cell search, and the preset time may be determined according to a temperature range to which a current temperature of the oscillator belongs and a preset correspondence. The preset correspondence includes a correspondence between multiple temperature ranges and at least one time value. Different temperature ranges may correspond to different preset times, or multiple temperature ranges may correspond to a same preset time.

Figure 5:
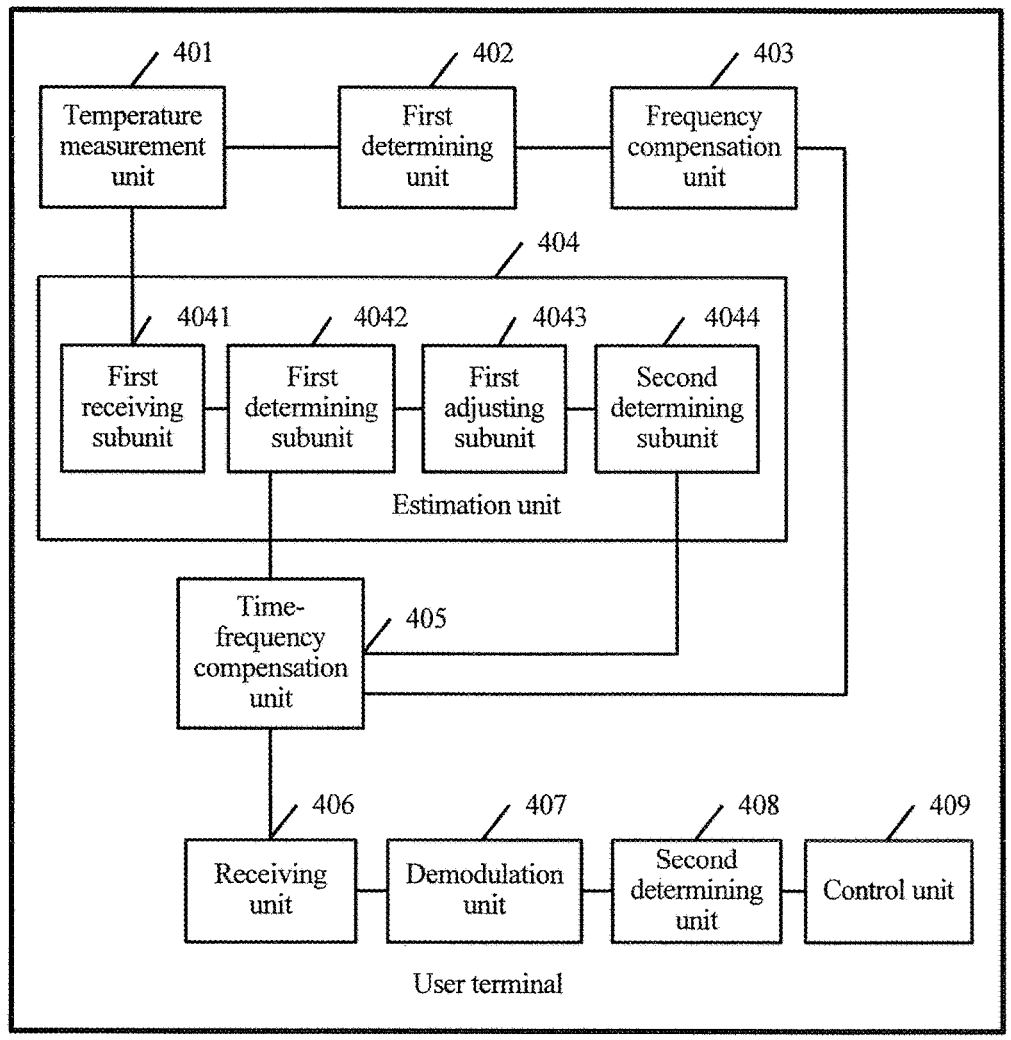
FIG. 5 is another schematic structural diagram of a user terminal disclosed in an embodiment of the present invention.

Correspondingly, further referring to FIG. 5, FIG. 5 is another schematic structural diagram of a user terminal disclosed in an embodiment of the present invention, and the user terminal may be configured to perform the time-frequency deviation compensation method disclosed in the embodiments of the present invention. The user terminal shown in FIG. 5 is obtained by optimizing the user terminal shown in FIG. 4. Compared with the user terminal shown in FIG. 4, the estimation unit 404 on the user terminal shown in FIG. 5 may include:

a first receiving subunit 4041, configured to receive, every the preset time, a first primary synchronization signal PSS and a first secondary synchronization signal SSS in communication between the user terminal and the serving cell;

a first determining subunit 4042, configured to separately perform cross-correlation processing between the first PSS and a pre-stored second PSS and between the first SSS and a pre-stored second SSS, so as to determine the time deviation between the user terminal and the serving cell, and use the time deviation as the time deviation estimated value;

a first adjusting subunit 4043, configured to separately adjust the first PSS and the first SSS according to the time deviation estimated value, to obtain a third PSS and a third SSS; and a second determining subunit 4044, configured to separately perform conjugate processing between the third PSS and the pre-stored second PSS and between the third SSS and the pre-stored second SSS, so as to determine the frequency deviation between the user terminal and the serving cell, and use the frequency deviation as the frequency deviation estimated value.

Figure 6:
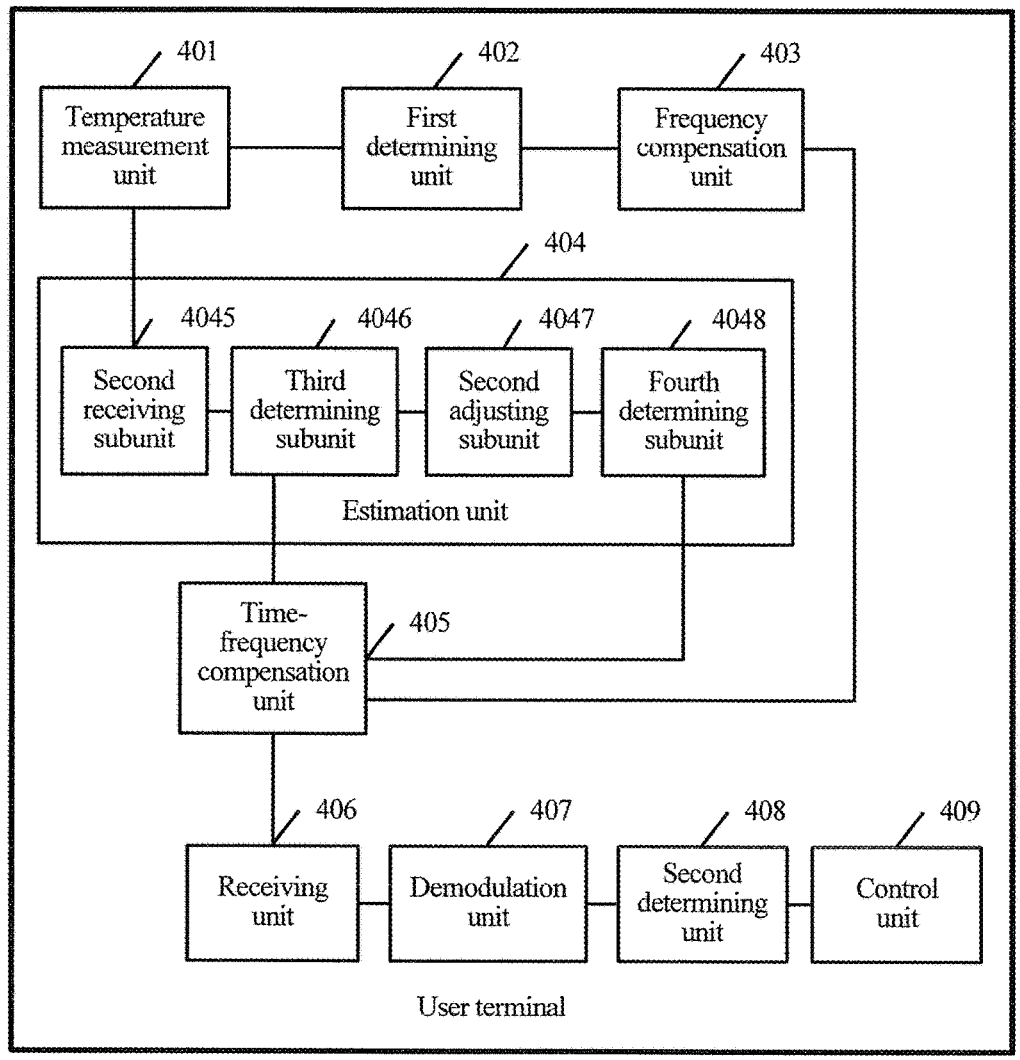
FIG. 6 is still another schematic structural diagram of a user terminal disclosed in an embodiment of the present invention.

As an optional implementation manner, further referring to FIG. 6, FIG. 6 is still another schematic structural diagram of a user terminal disclosed in an embodiment of the present invention, and the user terminal may be configured to perform the time-frequency deviation compensation method disclosed in the embodiments of the present invention. The user terminal shown in FIG. 6 is obtained by further optimizing the user terminal shown in FIG. 4. Compared with the user terminal shown in FIG. 4, the estimation unit 404 on the user terminal shown in FIG. 6 may include:

a second receiving subunit 4045, configured to receive a first physical broadcast channel PBCH signal sent by the serving cell of the user terminal;

a third determining subunit 4046, configured to perform cross-correlation processing between the first PBCH signal and a pre-stored PBCH signal, so as to determine the time deviation between the user terminal and the serving cell, and use the time deviation as the time deviation estimated value;

a second adjusting subunit 4047, configured to adjust the first PBCH signal according to the time deviation estimated value; and a fourth determining subunit 4048, configured to perform conjugate processing between the adjusted first PBCH signal and the pre-stored PBCH signal, so as to determine the frequency deviation between the user terminal and the serving cell, and use the frequency deviation as the frequency deviation estimated value.

As an optional implementation manner, the user terminal shown in FIG. 5 and FIG. 6 may further include:

a receiving unit 406, configured to receive a second PBCH signal sent by the serving cell;

a demodulation unit 407, configured to demodulate the second PBCH signal;

a second determining unit 408, configured to: when the demodulation unit 407 fails to demodulate the second PBCH signal, determine that a time-frequency deviation remaining on the user terminal after the time-frequency compensation exceeds a third preset threshold, where the third preset threshold is a maximum time-frequency deviation allowed for maintaining normal communication by the user terminal; and a control unit 409, configured to control the user terminal to perform a network search.

In this implementation manner, when the time-frequency deviation is small, the second PBCH signal is easy to be successfully demodulated even if a signal to noise ratio is relatively low. If the second PBCH signal fails to be demodulated, it indicates that a relatively large time deviation or frequency deviation or both still remain in a system after the time compensation and the frequency compensation are performed. The relatively large remaining time deviation or frequency deviation or both cause user terminal system hanging, and normal communication cannot be completed. In this case, the user terminal may be controlled to perform a network re-search, so that the system hanging is terminated, and normal communication of the user terminal is restored.

In this embodiment of the present invention, according to the user terminal described in FIG. 4 to FIG. 6, a temperature compensation exception can be effectively identified by monitoring a temperature variation of an oscillator, and a time-frequency deviation caused by the temperature compensation exception is estimated and compensated in time, so that the user terminal can maintain normal communication. Further, when a time-frequency deviation remaining in a system after temperature compensation is within an estimation capability, the user terminal can still work normally; or when a time-frequency deviation remaining in a system after temperature compensation is relatively large and exceeds an estimation capability, such situation can be detected, and system hanging is terminated by means of a network re-search, so that normal communication of the user terminal is restored, and the user terminal is protected.

Figure 7:
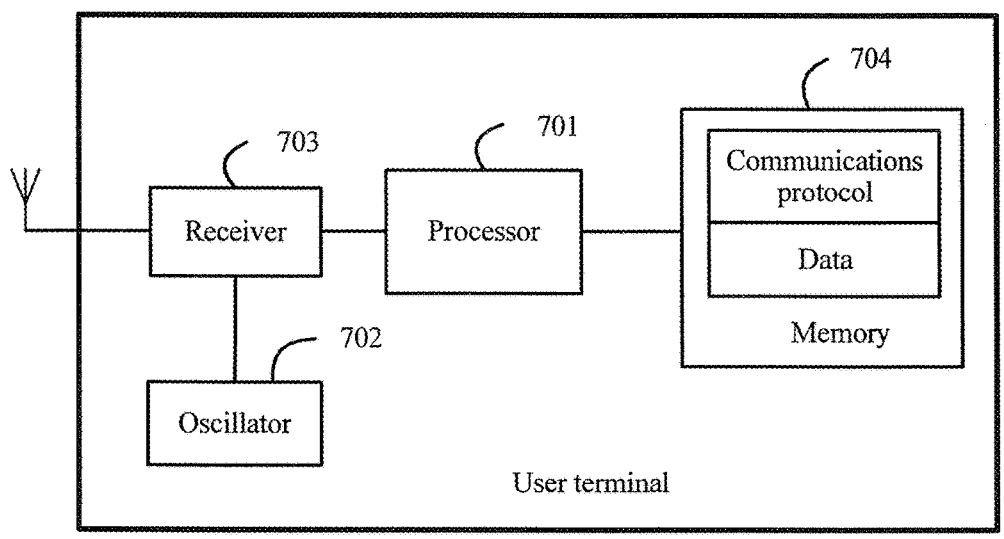
FIG. 7 is yet another schematic structural diagram of a user terminal disclosed in an embodiment of the present invention.

Referring to FIG. 7, FIG. 7 is another schematic structural diagram of a user terminal disclosed in an embodiment of the present invention, and the user terminal may be configured to perform the time-frequency deviation compensation method disclosed in the embodiments of the present invention. As shown in FIG. 7, the user terminal 700 may include components such as at least one processor 701, at least one oscillator 702, at least one receiver 703, and at least one 704. Persons skilled in the art may understand that the structure of the user terminal shown in FIG. 7 does not constitute a limitation on this embodiment of the present invention. The structure may not only be a bus structure, but may also be a star structure, and may further include more or fewer parts than those shown in the figure, or combine some parts, or have different part arrangements.

In this embodiment of the present invention, the processor 701 is a control center of the user terminal, and executes, by running or executing a program and/or a module stored in the memory 704 and by invoking data stored in the memory 704, various functions of the user terminal and data processing. The processor 701 may be formed by an integrated circuit (Integrated Circuit, IC for short), for example, may be formed by a single packaged IC, or may be formed by multiple packaged ICs that are connected and with a same function or different functions. For example, the processor 701 may be an SOC chip that includes an application processor, a baseband processor, a digital signal processor (Digital Signal Processor, DSP for short), a graphics processing unit (Graphics Processing Unit, GPU for short), and the like, or may be a baseband processor used only for baseband signal processing, an application-specific integrated circuit ASIC, or the like.

In this embodiment of the present invention, the oscillator 702 may be a crystal oscillator XO, and mainly configured to output an oscillation frequency, and provide the processor 701 and the receiver 703 with a frequency signal required in working.

In this embodiment of the present invention, the receiver 703 may include a radio frequency front end and a radio frequency integrated circuit chip, and may be configured to receive an air interface signal.

In this embodiment of the present invention, the memory 704 may be a high-speed RAM memory, or may be a non-volatile memory (non-volatile memory), such as at least one disk storage. Optionally, the memory 704 may be at least one storage apparatus that is far from the processor 701. As shown in FIG. 7, as a computer storage medium, the memory 704 may include a communications protocol, an operating system, an application program, data, and the like. This embodiment of the present invention sets no limitation thereto.

On the user terminal 700 shown in FIG. 7, the processor 701 may be configured to invoke the application program stored in the memory 704, so as to execute the following operations:

measuring a temperature of the oscillator 702 when the user terminal 700 is in a discontinuous reception DRX state, so as to obtain a temperature variation amount of the oscillator 702 from a first time point to a second time point in a DRX cycle, where the first time point is a sleep start moment in the DRX cycle, and the second time point is a sleep end moment in the DRX cycle;

determining a frequency variation amount of the oscillator 702 in the DRX cycle according to the temperature variation amount and a preset mapping relationship that is between the temperature and a frequency and that is included in the data stored in the memory 704;

performing first frequency compensation on the user terminal 700 according to the frequency variation amount of the oscillator 702;

when the temperature variation amount exceeds a preset threshold included in the data stored in the memory 704, estimating a time deviation and a frequency deviation between the user terminal 700 and a serving cell of the user terminal 700, so as to obtain a time deviation estimated value and a frequency deviation estimated value; and performing time-frequency compensation on the user terminal 700 according to the time deviation estimated value and the frequency deviation estimated value.

In this embodiment of the present invention, the temperature of the oscillator 702 may be measured by using a component on the user terminal 700, such as a thermistor, a temperature sensor, or an infrared thermometer, and this embodiment of the present invention sets no limitation thereto.

As an optional implementation manner, a specific implementation manner in which the processor 701 estimates a time deviation and a frequency deviation between the user terminal 700 and a serving cell of the user terminal 700, so as to obtain a time deviation estimated value and a frequency deviation estimated value may be:

enabling a cell search every preset time to determine the time deviation and the frequency deviation between the user terminal 700 and the serving cell of the user terminal 700, so as to obtain the time deviation estimated value and the frequency deviation estimation deviation.

The user terminal 700 uses the preset time as a period to enable the cell search, and the preset time may be determined according to a temperature range to which a current temperature of the oscillator 702 belongs and a preset correspondence. The preset correspondence includes a correspondence between multiple temperature ranges and at least one time value. Different temperature ranges may correspond to different preset times, or multiple temperature ranges may correspond to a same preset time.

As an optional implementation manner, a specific implementation manner of the enabling, by the processor 701, a cell search every preset time to determine the time deviation and the frequency deviation between the user terminal 700 and the serving cell of the user terminal 700, so as to obtain the time deviation estimated value and the frequency deviation estimated value may be:

receiving, every the preset time by using the receiver 703, a first PSS and a first SSS in the communication between the user terminal 700 and the serving cell;

separately performing cross-correlation processing between the first PSS and a pre-stored second PSS and between the first SSS and a pre-stored second SSS, so as to determine the time deviation between the user terminal 700 and the serving cell, and using the time deviation as the time deviation estimated value;

separately adjusting the first PSS and the first SSS according to the time deviation estimated value, to obtain a third PSS and a third SSS; and separately performing conjugate processing between the third PSS and the pre-stored second PSS and between the third SSS and the pre-stored second SSS, so as to determine the frequency deviation between the user terminal 700 and the serving cell, and using the frequency deviation as the frequency deviation estimated value.

As an optional implementation manner, a specific implementation manner in which the processor 701 estimates a time deviation and a frequency deviation between the user terminal 700 and a serving cell of the user terminal 700, so as to obtain a time deviation estimated value and a frequency deviation estimated value may be:

receiving, by using the receiver 703, a first PBCH signal sent by the serving cell of the user terminal 700;

performing cross-correlation processing between the first PBCH signal and a pre-stored PBCH signal, so as to determine the time deviation between the user terminal 700 and the serving cell, and using the time deviation as the time deviation estimated value;

adjusting the first PBCH signal according to the time deviation estimated value; and performing conjugate processing between the adjusted first PBCH signal and the pre-stored PBCH signal, so as to determine the frequency deviation between the user terminal 700 and the serving cell, and using the frequency deviation as the frequency deviation estimated value.

As an optional implementation manner, a specific implementation manner in which the processor 701 performs first frequency compensation on the user terminal 700 according to the frequency variation amount may be:

performing first frequency compensation on at least one of the oscillator 702, the processor 701, or the receiver 703 according to the frequency variation amount.

As an optional implementation manner, a specific implementation manner in which the processor 701 performs time-frequency compensation on the user terminal 700 according to the time deviation estimated value and the frequency deviation estimated value may include at least one of the following cases:

when the time deviation estimated value exceeds a first preset threshold included in the data stored in the memory 704, performing time compensation on the processor 701 according to the time deviation estimated value; or when the frequency deviation estimated value exceeds a second preset threshold included in the data stored in the memory 704, performing, based on the first frequency compensation, second frequency compensation on at least one of the oscillator 702, the processor 701, or the receiver 703 according to the frequency deviation estimated value.

As an optional implementation manner, after performing the time-frequency compensation on the user terminal 700 according to the time deviation estimated value and the frequency deviation estimated value, the processor 701 may further invoke the application program stored in the memory 704 to execute the following operations:

receiving, by using the receiver 703, a second PBCH signal sent by the serving cell;

demodulating the second PBCH signal;

if the second PBCH signal fails to be demodulated, determining that a time-frequency deviation remaining on the user terminal 700 after the time-frequency compensation exceeds a third preset threshold included in the data stored in the memory 704, where the third preset threshold is a maximum time-frequency deviation allowed for maintaining normal communication by the user terminal 700; and controlling the user terminal 700 to perform a network search.

Specifically, the user terminal according to in this embodiment of the present invention can implement a part of or all processes of the time-frequency deviation compensation method embodiment described with reference to FIG. 2 or FIG. 3A and FIG. 3B in the present invention.

In this embodiment of the present invention, according to the user terminal described in FIG. 7, a temperature compensation exception can be effectively identified by monitoring a temperature variation of an oscillator, and a time-frequency deviation caused by the temperature compensation exception is estimated and compensated in time, so that the user terminal can maintain normal communication. Further, when a time-frequency deviation remaining in a system after temperature compensation is within an estimation capability, the user terminal can still work normally; or when a time-frequency deviation remaining in a system after temperature compensation is relatively large and exceeds an estimation capability, such situation can be detected, and system hanging is terminated by means of a network re-search, so that normal communication of the user terminal is restored, and the user terminal is protected.

Each module or submodule in the embodiments of the present invention can be implemented by using a universal integrated circuit, for example, a CPU (Central Processing Unit, central processing unit), or be implemented by using an ASIC.

It should be noted that, for a brief description, the foregoing method embodiments are represented as a series of actions. However, persons skilled in the art should appreciate that the present invention is not limited to the described order of the actions, because according to this application, some steps may be performed in another order or simultaneously. It should be further appreciated by persons skilled in the art that the embodiments described in this specification all belong to examples, and the involved actions and modules are not necessarily required by the present application.

In the foregoing embodiments, the description of each embodiment has respective focuses. For a part that is not described in detail in an embodiment, reference may be made to related descriptions in other embodiments.

A sequence of the steps of the method in the embodiments of the present invention may be adjusted, and certain steps may be merged or removed according to an actual requirement.

The units or modules of a user terminal in the embodiments of the present invention may be combined, divided, or deleted according to an actual requirement.

Persons of ordinary skill in the art may understand that, all or a part of the steps in each method of the foregoing embodiments may be implemented by a program instructing related hardware. The program may be stored in a computer readable storage medium. The storage medium includes a read-only memory (Read-Only Memory, ROM), a random access memory (Random Access Memory, RAM), a programmable read-only memory (Programmable Read-only Memory, PROM), an erasable programmable read-only memory (Erasable Programmable Read Only Memory, EPROM), a one-time programmable read-only memory (One-time Programmable Read-Only Memory, OTPROM), an electrically-erasable programmable read-only memory, (Electrically-Erasable Programmable Read-Only Memory, EEPROM), a compact disc read-only memory (Compact Disc Read-Only Memory, CD-ROM), or another optical disk memory, magnetic disk memory, magnetic tape memory, or any other computer readable medium that can be configured to carry or store data.

The time-frequency deviation compensation method and the user terminal disclosed in the embodiments of the present invention are described in detail above. The principle and implementation manners of the present invention are described by using specific examples. The description of the embodiments is merely used to help understand the method and core ideas of the present invention. In addition, persons of ordinary skill in the art can make variations and modifications to the present invention in terms of the specific implementation manners and application scopes according to the ideas of the present invention. Therefore, the content of the specification shall not be understood as a limitation to the present invention.

What is claimed is:

1. A time-frequency deviation compensation method for use with a user terminal in a discontinuous reception (DRX) state, the method comprising:
measuring a temperature of an oscillator on the user terminal, so as to obtain a temperature variation amount of the oscillator from a first time point to a second time point in a DRX cycle, wherein the first time point is a sleep start moment in the DRX cycle, and the second time point is a sleep end moment in the DRX cycle;
determining a frequency variation amount of the oscillator in the DRX cycle according to the temperature variation amount and a preset mapping relationship between the temperature and a frequency;
performing first frequency compensation on the user terminal according to the frequency variation amount;
estimating a time deviation and a frequency deviation between the user terminal and a serving cell of the user terminal when the temperature variation amount exceeds a preset threshold, so as to obtain a time deviation estimated value and a frequency deviation estimated value; and
performing time-frequency compensation on the user terminal according to the time deviation estimated value and the frequency deviation estimated value.

2. The method according to claim 1, wherein estimating a time deviation and a frequency deviation between the user terminal and a serving cell of the user terminal, so as to obtain a time deviation estimated value and a frequency deviation estimated value comprises:
enabling a cell search every preset time to determine the time deviation and the frequency deviation between the user terminal and the serving cell of the user terminal, so as to obtain the time deviation estimated value and the frequency deviation estimated value.

3. The method according to claim 2, wherein the preset time is determined according to a temperature range to which a current temperature of the oscillator belongs and a preset correspondence, and the preset correspondence comprises a correspondence between multiple temperature ranges and at least one time value.

4. The method according to claim 2, wherein enabling a cell search every preset time to determine the time deviation and the frequency deviation between the user terminal and the serving cell of the user terminal, so as to obtain the time deviation estimated value and the frequency deviation estimated value comprises:
receiving, for every preset time, a first primary synchronization signal (PSS) and a first secondary synchronization signal (SSS) in communication between the user terminal and the serving cell;
separately performing cross-correlation processing between the first PSS and a pre-stored second PSS and between the first SSS and a pre-stored second SSS, so as to determine the time deviation between the user terminal and the serving cell, and using the time deviation as the time deviation estimated value;
separately adjusting the first PSS and the first SSS according to the time deviation estimated value, to obtain a third PSS and a third SSS; and
separately performing conjugate processing between the third PSS and the pre-stored second PSS and between the third SSS and the pre-stored second SSS, so as to determine the frequency deviation between the user terminal and the serving cell, and using the frequency deviation as the frequency deviation estimated value.

5. The method according to claim 1, wherein estimating a time deviation and a frequency deviation between the user terminal and a serving cell of the user terminal, so as to obtain a time deviation estimated value and a frequency deviation estimated value comprises:
receiving a first physical broadcast channel (PBCH) signal sent by the serving cell of the user terminal;
performing cross-correlation processing between the first PBCH signal and a pre-stored PBCH signal, so as to determine the time deviation between the user terminal and the serving cell, and using the time deviation as the time deviation estimated value;
adjusting the first PBCH signal according to the time deviation estimated value; and
performing conjugate processing between the adjusted first PBCH signal and the pre-stored PBCH signal, so as to determine the frequency deviation between the user terminal and the serving cell, and using the frequency deviation as the frequency deviation estimated value.

6. The method according to claim 1, wherein performing time-frequency compensation on the user terminal according to the time deviation estimated value and the frequency deviation estimated value comprises at least one of the following cases:
when the time deviation estimated value exceeds a first preset threshold, performing time compensation on the user terminal according to the time deviation estimated value; or
when the frequency deviation estimated value exceeds a second preset threshold, performing, based on the first frequency compensation, second frequency compensation on the user terminal according to the frequency deviation estimated value.

7. The method according to claim 1, after performing time-frequency compensation on the user terminal according to the time deviation estimated value and the frequency deviation estimated value, the method further comprises:

receiving a second physical broadcast channel (PBCH) signal sent by the serving cell;

demodulating the second PBCH signal;

if the second PBCH signal fails to be demodulated, determining that a time-frequency deviation remaining on the user terminal after the time-frequency compensation exceeds a third preset threshold, wherein the third preset threshold is a maximum time-frequency deviation allowed for maintaining normal communication by the user terminal; and controlling the user terminal to perform a network search.

8. A user terminal, comprising:

an oscillator configured to provide a frequency signal; and a processor configured to:

measure a temperature of the oscillator when the user terminal is in a discontinuous reception (DRX) state, so as to obtain a temperature variation amount of the oscillator from a first time point to a second time point in a DRX cycle, wherein the first time point is a sleep start moment in the DRX cycle, and the second time point is a sleep end moment in the DRX cycle;

determine a frequency variation amount of the oscillator in the DRX cycle according to the temperature variation amount and a preset mapping relationship between the temperature and a frequency;

perform first frequency compensation on the user terminal according to the frequency variation amount;

estimate a time deviation and a frequency deviation between the user terminal and a serving cell of the user terminal when the temperature variation amount exceeds a preset threshold, so as to obtain a time deviation estimated value and a frequency deviation estimated value; and perform time-frequency compensation on the user terminal according to the time deviation estimated value and the frequency deviation estimated value.

9. The user terminal according to claim 8, wherein the processor is configured to enable a cell search every preset time to determine the time deviation and the frequency deviation between the user terminal and the serving cell of the user terminal, so as to obtain the time deviation estimated value and the frequency deviation estimated value.

10. The user terminal according to claim 9, wherein the preset time is determined according to a temperature range to which a current temperature of the oscillator belongs and a preset correspondence, and the preset correspondence comprises a correspondence between multiple temperature ranges and at least one time value.

11. The user terminal according to claim 9, further comprising:

a receiver; and wherein the processor is configured to:

receive, for every preset time by using the receiver, a first primary synchronization signal PSS and a first secondary synchronization signal SSS in communication between the user terminal and the serving cell;

separately perform cross-correlation processing between the first PSS and a pre-stored second PSS and between the first SSS and a pre-stored second SSS, so as to determine the time deviation between the user terminal and the serving cell, and use the time deviation as the time deviation estimated value;

separately adjust the first PSS and the first SSS according to the time deviation estimated value, to obtain a third PSS and a third SSS; and separately perform conjugate processing between the third PSS and the pre-stored second PSS and between the third SSS and the pre-stored second SSS, so as to determine the frequency deviation between the user terminal and the serving cell, and use the frequency deviation as the frequency deviation estimated value.

12. The user terminal according to claim 8, wherein the processor is configured to:

receive, by using the receiver, a first physical broadcast channel (PBCH) signal sent by the serving cell of the user terminal;

perform cross-correlation processing between the first PBCH signal and a pre-stored PBCH signal, so as to determine the time deviation between the user terminal and the serving cell, and use the time deviation as the time deviation estimated value;

adjust the first PBCH signal according to the time deviation estimated value; and perform conjugate processing between the adjusted first PBCH signal and the pre-stored PBCH signal, so as to determine the frequency deviation between the user terminal and the serving cell, and use the frequency deviation as the frequency deviation estimated value.

13. The user terminal according to claim 8, wherein the processor is configured to:

perform first frequency compensation on at least one of the oscillator, the processor, or the receiver according to the frequency variation amount.

14. The user terminal according to claim 8, wherein the processor is further configured to:

when the time deviation estimated value exceeds a first preset threshold, perform time compensation on the processor according to the time deviation estimated value; or when the frequency deviation estimated value exceeds a second preset threshold, perform based on the first frequency compensation, second frequency compensation on at least one of the oscillator, the processor, or the receiver according to the frequency deviation estimated value.

15. The user terminal according to claim 8, wherein the processor is further configured to:

receive, by using the receiver, a second physical broadcast channel (PBCH) signal sent by the serving cell;

demodulate the second PBCH signal;

if the second PBCH signal fails to be demodulated, determine that a time-frequency deviation remaining on the user terminal after the time-frequency compensation exceeds a third preset threshold, wherein the third preset threshold is a maximum time-frequency deviation allowed for maintaining normal communication by the user terminal; and control the user terminal to perform a network search.

16. A system-on-chip for use in a terminal having an oscillator and a RF receiver, the system-on-chip comprising:

a processor;

memory in electronic communication with the processor and comprising instructions stored in the memory which, when executed by the processor, cause the system-on-chip to:

obtain a temperature of the oscillator when the terminal is in a discontinuous reception (DRX) state, so as to obtain a temperature variation amount of the oscillator from a first time point to a second time point in a DRX cycle, wherein the first time point is a sleep start moment in the DRX cycle, and the second time point is a sleep end moment in the DRX cycle, determine a frequency variation amount of the oscillator in the DRX cycle according to the temperature variation amount and a mapping relationship between the temperature and a frequency;

perform, according to the frequency variation amount, first frequency compensation on at least one of the oscillator, the RF receiver or the processor, estimate a time deviation and a frequency deviation between the terminal and a serving cell of the terminal when the temperature variation amount exceeds a threshold, so as to obtain a time deviation estimated value and a frequency deviation estimated value, and perform, according to the time deviation estimated value and the frequency deviation estimated value, time-frequency compensation on the terminal.

17. The system-on-chip according to claim 16, wherein the instructions, when executed by the processor, cause the system-on-chip to enable a cell search every preset time to determine the time deviation and the frequency deviation between the terminal and the serving cell of the terminal, so as to obtain the time deviation estimated value and the frequency deviation estimated value.

18. The system-on-chip according to claim 17, wherein the preset time is determined according to a temperature range to which a current temperature of the oscillator belongs and a correspondence, and the correspondence comprises a correspondence between multiple temperature ranges and at least one time value.

19. The system-on-chip according to claim 17, wherein the instructions, when executed by the processor, cause the system-on-chip to:

receive, for every preset time by using the receiver, a first primary synchronization signal (PSS) and a first secondary synchronization signal (SSS) in communication between the terminal and the serving cell;

separately perform cross-correlation processing between the first PSS and a pre-stored second PSS and between the first SSS and a pre-stored second SSS, so as to determine the time deviation between the terminal and the serving cell, and use the time deviation as the time deviation estimated value;

separately adjust the first PSS and the first SSS according to the time deviation estimated value, to obtain a third PSS and a third SSS; and separately perform conjugate processing between the third PSS and the pre-stored second PSS and between the third SSS and the pre-stored second SSS, so as to determine the frequency deviation between the terminal and the serving cell, and use the frequency deviation as the frequency deviation estimated value.

20. The system-on-chip according to claim 16, wherein the instructions, when executed by the processor, cause the system-on-chip to:

receive, through the receiver, a first physical broadcast channel (PBCH) signal sent by the serving cell;

perform cross-correlation processing between the first PBCH signal and a pre-stored PBCH signal, so as to determine the time deviation between the terminal and the serving cell, and use the time deviation as the time deviation estimated value;

adjust the first PBCH signal according to the time deviation estimated value; and perform conjugate processing between the adjusted first PBCH signal and the pre-stored PBCH signal, so as to determine the frequency deviation between the terminal and the serving cell, and use the frequency deviation as the frequency deviation estimated value.

21. The system-on-chip according to claim 16, wherein the instructions, when executed by the processor, cause the system-on-chip to:

when the time deviation estimated value exceeds a first threshold, perform time compensation on the processor according to the time deviation estimated value; or when the frequency deviation estimated value exceeds a second threshold, perform based on the first frequency compensation, second frequency compensation on at least one of the oscillator, the processor, or the receiver according to the frequency deviation estimated value.

22. The system-on-chip according to claim 16, wherein the instructions, when executed by the processor, cause the system-on-chip to:

receive, by using the receiver, a second physical broadcast channel (PBCH) signal sent by the serving cell;

demodulate the second PBCH signal;

when the second PBCH signal fails to be demodulated, determine that a time-frequency deviation remaining on the terminal after the time-frequency compensation exceeds a third threshold, wherein the third threshold is a maximum time-frequency deviation allowed for maintaining normal communication by the terminal; and control the terminal to perform a network search.

* * * * *